(12) United States Patent
Ozaki et al.

(10) Patent No.: US 6,924,883 B2
(45) Date of Patent: Aug. 2, 2005

(54) EXPOSURE DEVICE

(75) Inventors: Takao Ozaki, Kanagawa (JP); Koji Wada, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 82 days.

(21) Appl. No.: 10/706,035

(22) Filed: Nov. 13, 2003

(65) Prior Publication Data

US 2004/0095564 A1 May 20, 2004

(30) Foreign Application Priority Data

Nov. 15, 2002 (JP) ........................................ 2002-332201

(51) Int. Cl.⁷ .................. G03B 27/42; G03B 27/54; G03B 27/58; G01B 11/00
(52) U.S. Cl. .................. 355/53; 355/67; 355/72; 356/401
(58) Field of Search .................. 355/53, 72, 75, 355/67; 356/399, 400, 401; 250/492.22; 359/618, 290

Primary Examiner—Peter B. Kim
(74) Attorney, Agent, or Firm—Sughrue Mion, PLLC

(57) ABSTRACT

A laser exposure device at which alignment marks of a plate material on an exposure stage, which is moving in a direction opposite to a scanning direction, are read by a CCD camera mounted at a support gate, after which an imaging region, whose position is judged using the alignment marks, is exposed by a laser beam from a laser scanner. Here, a distance along the scanning direction from the CCD camera to the laser scanner is not less than a pitch of the alignment marks that are provided to respectively correspond to a trailing end and a leading end of the imaging region. According to this laser exposure device, even in a case in which a plurality of the imaging region is provided at a recording medium, an increase in a duration for forming images on the recording medium in accordance with an increase in imaging regions is prevented.

18 Claims, 23 Drawing Sheets

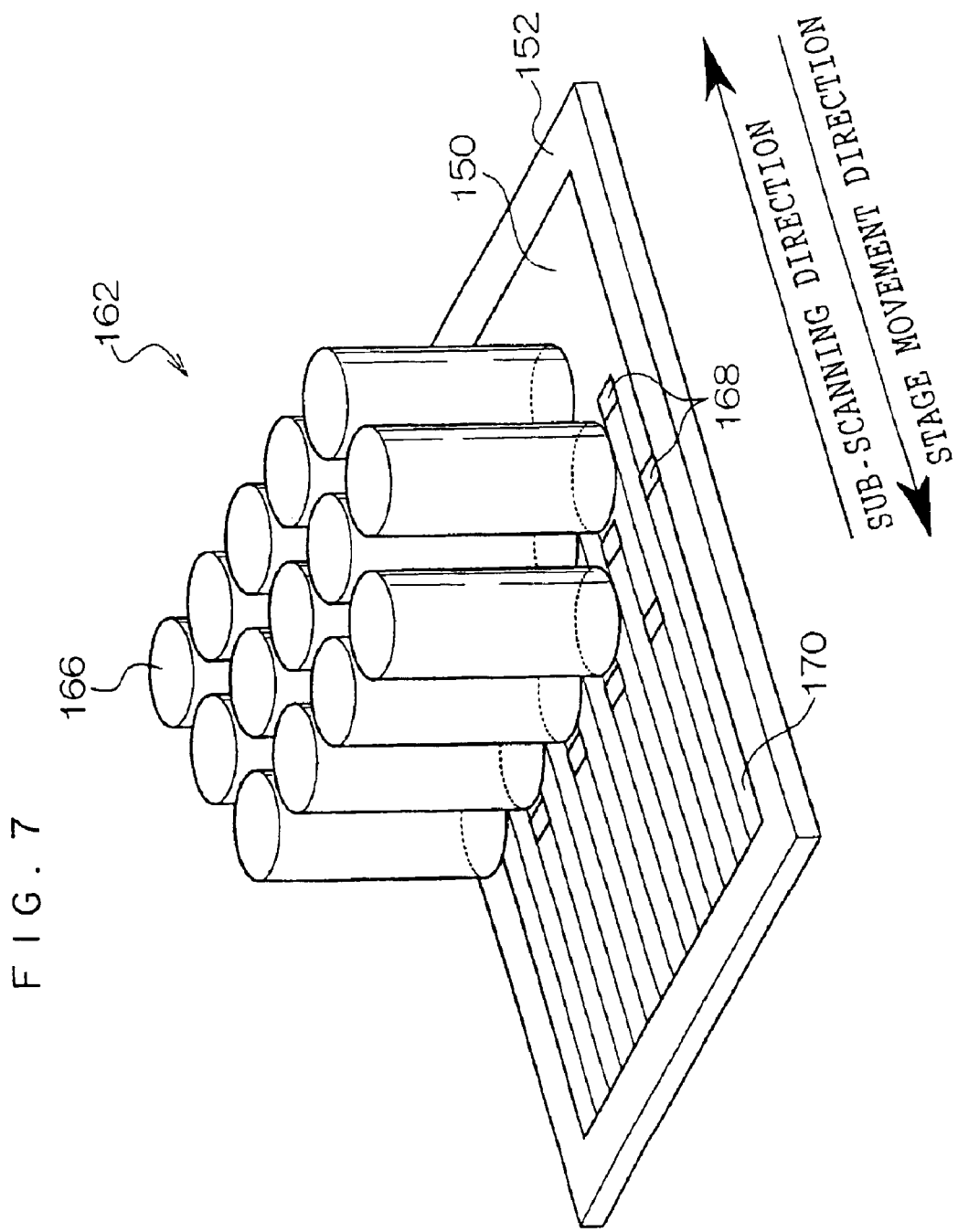

EXPOSED REGION

SUB-SCANNING DIRECTION

ONE CYCLE OF FIXED LOW SPEED SCANNING (40 mm/s)

170 m ROWS n COLUMNS

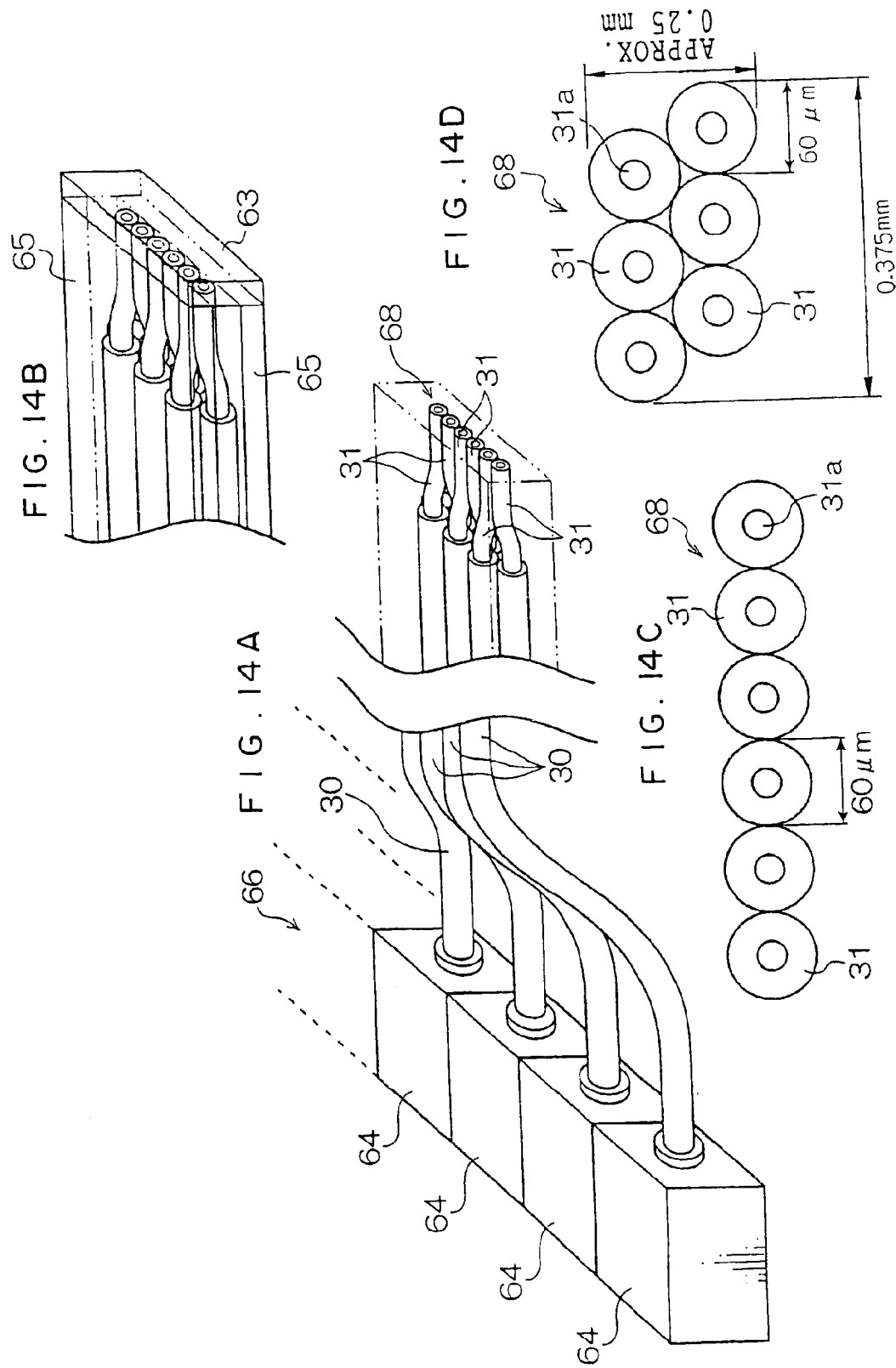

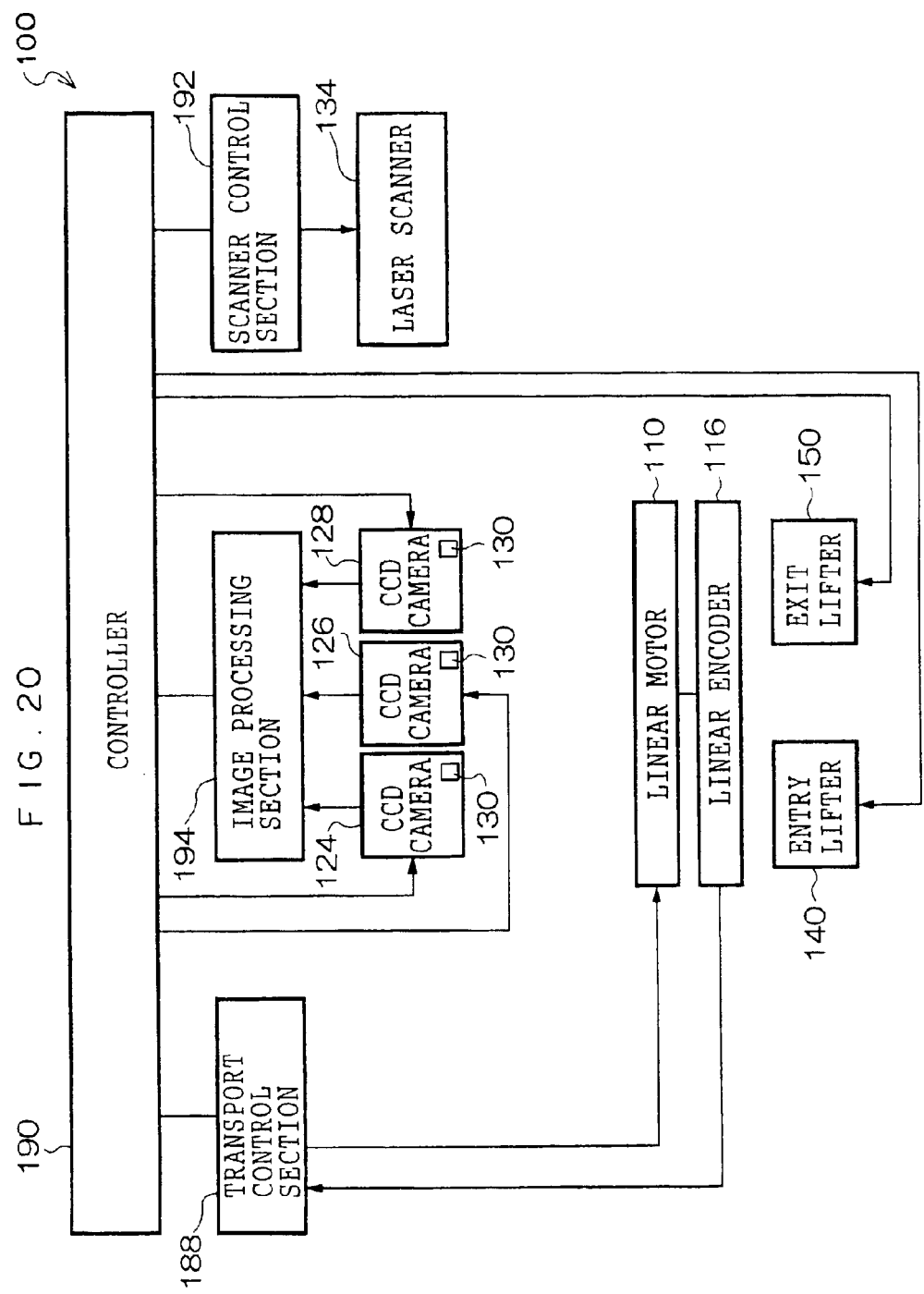

EXPOSURE DEVICE

CROSS-REFERENCE TO RELATED APPLICATION

This application claims priority under 35 USC 119 from Japanese Patent Application No. 2002-332201, the disclosures of which are incorporated by reference herein.

BACKGROUND OF THE INVENTION

1. Field of the Invention

The present invention relates to an exposure device for exposing an imaging region and forming an image at a recording medium, such as a printed circuit board or the like, with a laser beam which is modulated in accordance with image data.

2. Description of the Related Art

Devices disclosed in, for example, Japanese Patent Application Laid-Open (JP-A) No. 2000-275863 are known as laser exposure devices for forming wiring patterns of printed circuit boards and the like.

In a scanning imaging device described in JP-A No. 2000-275863, positioning holes (alignment marks) are provided respectively at four corners of a printed circuit board, which is placed on a table for conveyance of the board. The positioning holes are moved along a sub-scanning direction with the table from a standby position to a position of measurement by a CCD camera. This CCD camera image-captures each of the positioning holes of the printed circuit board. Hence, processing for alignment of image data is executed after shifting (converting co-ordinates of) an imaging object region through imaging co-ordinates such that the imaging object region corresponds to a position of the printed circuit board as obtained by the image capture. Thereafter, the table is returned to the standby position. Then, while the table is being moved in the sub-scanning direction at a predetermined image formation speed, a latent image corresponding to a wiring pattern is formed at a predetermined region (the imaging region) of the printed circuit board by scanning and exposing the printed circuit board with a laser beam. The laser beam is modulated at exposure positions of the laser beam on the basis of the image data and deflected in a main scanning direction by a polygon mirror.

In the laser exposure device as disclosed in JP-A No. 2000-275863, in a case in which image formation is to be carried out at a single imaging region of the printed circuit board, exposure of the imaging region of the printed circuit board cannot commence until the printed circuit board has moved from the standby position to the position of measurement of the alignment marks, the positions of the alignment marks of the printed circuit board have been measured, and then the printed circuit board has returned to the standby position.

Further, in order to improve productivity and imaging accuracy at a printed circuit board, there is a method of providing a plurality of imaging regions at which respectively independent wiring patterns are formed and a plurality of alignment marks which are in respective correspondence with these imaging regions, in a print circuit board.

If respective wiring patterns are formed at a plurality of imaging regions of a printed circuit board by the laser exposure device described in JP-A No. 2000-275863, when exposure of one of the imaging regions finishes, exposure of the next imaging region of the printed circuit board cannot be commenced until after the printed circuit board has temporarily returned from an exposure position to a standby position, and position measurement of the corresponding set of alignment marks after has been completed.

In consequence, in such a laser exposure device, as the number of imaging regions provided at a printed circuit board increases, the amount of time required for position measurement of the alignment marks increases, and an image-forming time for the whole of one printed circuit board increases remarkably.

SUMMARY OF THE INVENTION

In consideration of the circumstances described above, an object of the present invention is to provide an exposure device which, in a case in which a plurality of imaging regions are provided at a recording medium, is capable of preventing an increase in a duration of image formation on the recording medium in accordance with an increase in the number of imaging regions.

In order to achieve the object described above, in a first aspect of the present invention, an exposure device for exposing a predetermined imaging region at a recording medium with a light beam, which has beens modulated in accordance with image data, for forming an image corresponding to the image data at the imaging region, the exposure device comprises: an exposure stage on which the recording medium is placed; a reading section which, at a reading position facing the recording medium on the exposure stage, reads alignment marks from the recording medium, the alignment marks having been provided to correspond to the imaging region; an information processing section which determines a position of the imaging region at the recording medium on the basis of read information from the reading section, and performs position conversion processing on the image data in accordance with the position of the imaging region; and an exposure section disposed at an upstream side, along a scanning direction, of the reading section, which exposure section exposes, at an exposure position facing the recording medium on the exposure stage, the imaging region of the recording medium with the light beam, which has been modulated on the basis of image data from the information processing section, for forming the image at the imaging region, wherein the reading section and the exposure section are structured to be relatively movable in the scanning direction with respect to the recording medium on the exposure stage, by at least one of relatively moving the exposure stage with respect to the reading section and the exposure section and relatively moving the reading section and the exposure section with respect to the exposure stage, and before commencement of exposure of the imaging region by the exposure section, the reading section reads the alignment marks that correspond to at least one of a leading end and trailing end of the imaging region that is to be exposed by the exposure section and a leading end and trailing end of a sub-region into which the imaging region is divided in the scanning direction, and the information processing section performs the position conversion processing on the image data on the basis of read information of these alignment marks.

In an exposure device based on the present aspect, the distance along the scanning direction from the reading section to the exposure section is set to a length not less than the maximum pitch of the alignment marks which are provided to correspond to the imaging regions. As a result, when an imaging region of the recording medium is to be exposed by the light beam from the exposure section, at a point in time at which an alignment mark corresponding to the leading end of this imaging region reaches the exposure position, an alignment mark corresponding to the trailing end of this imaging region, or of a sub-region into which the imaging region is divided, will definitely have passed the reading position. That is, the alignment marks corresponding respectively to the leading end and trailing end of the imaging region or sub-region will have already been read by the reading section.

Accordingly, it is possible that, while the relative movement of the recording medium in the scanning direction is continued from commencement to completion of the exposure of the arbitrary imaging region, position and inclination of the imaging region is determined and conversion processing is executed on the image data, and thereafter, a laser scanner exposes the imaging region, which is an object of exposure, with the light beam modulated on the basis of the image data.

That is, the laser scanner is capable of exposing the imaging region which is the object of exposure, with the light beam modulated on the basis of the image data, without stopping the recording medium in order to read the alignment marks or returning the recording medium in a direction opposite to the scanning direction.

Consequently, even in a case in which a plurality of imaging regions are provided on the recording medium, an increase in an amount of time for image formation on the recording medium in accordance with the increase in imaging regions can be avoided.

In a second aspect of the present invention, an exposure device for exposing a predetermined imaging region at a recording medium with a light beam, which has been modulated in accordance with image data, for forming an image corresponding to the image data at the imaging region, the exposure device comprises: an exposure stage on which the recording medium is placed; a reading section which, while moving in a predetermined scanning direction, reads alignment marks from the recording medium, at a reading position facing the recording medium on the exposure stage, the alignment marks having been provided to correspond to the imaging region; an information processing section which determines a position of the imaging region at the recording medium on the basis of information read by the reading section, and performs position conversion processing on the image data in accordance with the position of the imaging region; an exposure section disposed at an upstream side, along the scanning direction, of the reading section, which exposure section, while moving in the scanning direction, exposes, at an exposure position facing the recording medium on the exposure stage, the imaging region of the recording medium with the light beam, which has been modulated on the basis of image data from the information processing section, for forming the image at the imaging region; an exposure section-driving section which, during exposure of the imaging region, whose position has been determined by the information processing section, moves the exposure section in the scanning direction at a speed for image formation of the imaging region; and a reading section-driving section which moves the reading section along the scanning direction such that the reading section passes reading positions of the alignment marks that correspond to at least one of a leading end and trailing end of the imaging region that is to be exposed by the exposure section and a leading end and trailing end of a sub-region, into which the imaging region is divided in the scanning direction, before commencement of exposure of the imaging region by the exposure section.

In an exposure device based on the present aspect, at a time of exposure of an imaging region whose position has been determined by the information processing section, the exposure section-driving section moves the exposure section over this imaging region in the scanning direction at the speed for image formation. Further, the reading section-driving section moves the reading section along the scanning direction such that, before the commencement of exposure of the imaging region by the exposure section, the reading section has passed the reading positions of the alignment marks provided to correspond to the leading end and trailing end of the imaging region that is to be exposed by this exposure section, or the leading end and trailing end of the sub-region into which this imaging region is divided in the scanning direction.

Therefore, at a point in time at which exposure of an arbitrary imaging region or sub-region of the recording medium by the light beam from the exposure section commences, that is, at a point in time at which the exposure section reaches the leading end of the imaging region or sub-region that is an object of exposure, the reading section has already passed the respective alignment marks corresponding to the leading end and trailing end of this imaging region or sub-region, and the alignment marks respectively corresponding to the leading end and trailing end of the imaging region, or the leading end and trailing end of the sub-region, have already been read by the reading section.

Accordingly, while the exposure region is kept moving at a predetermined speed for exposure from commencement to completion of the exposure of the recording medium, position and inclination of the imaging region or sub-region are determined and conversion processing is executed on the image data, and then the imaging region or sub-region that is the object of exposure can be exposed by the exposure section.

That is, the position and inclination of the imaging region or sub-region can be determined, the conversion processing can be executed on the image data and the imaging region or sub-region that is the object of exposure can be exposed without stopping the exposure section in order to wait for the alignment marks to be read by the reading section.

Consequently, even in a case in which a plurality of imaging regions are provided on the recording medium, an increase in time for image formation on the recording medium in accordance with the increase in imaging regions can be avoided.

BRIEF DESCRIPTION OF THE DRAWINGS

FIG. 7 is a perspective view showing structure of a scanner of an exposure device relating to an embodiment of the present invention.

FIG. 14A is a perspective view showing structure of a fiber array light source.

FIG. 14B is a partial enlarged view of FIG. 14A.

FIG. 14C is a plan view showing an arrangement of light emission points at a laser emission portion.

FIG. 14D is a plan view showing another arrangement of light emission points at a laser emission portion.

FIG. 20 is a block diagram showing general structure of a control system of the laser exposure device relating to the first embodiment of the present invention.

DETAILED DESCRIPTION OF THE INVENTION

Below, embodiments of the present invention will be described in detail with reference to the drawings.

Figure 1:
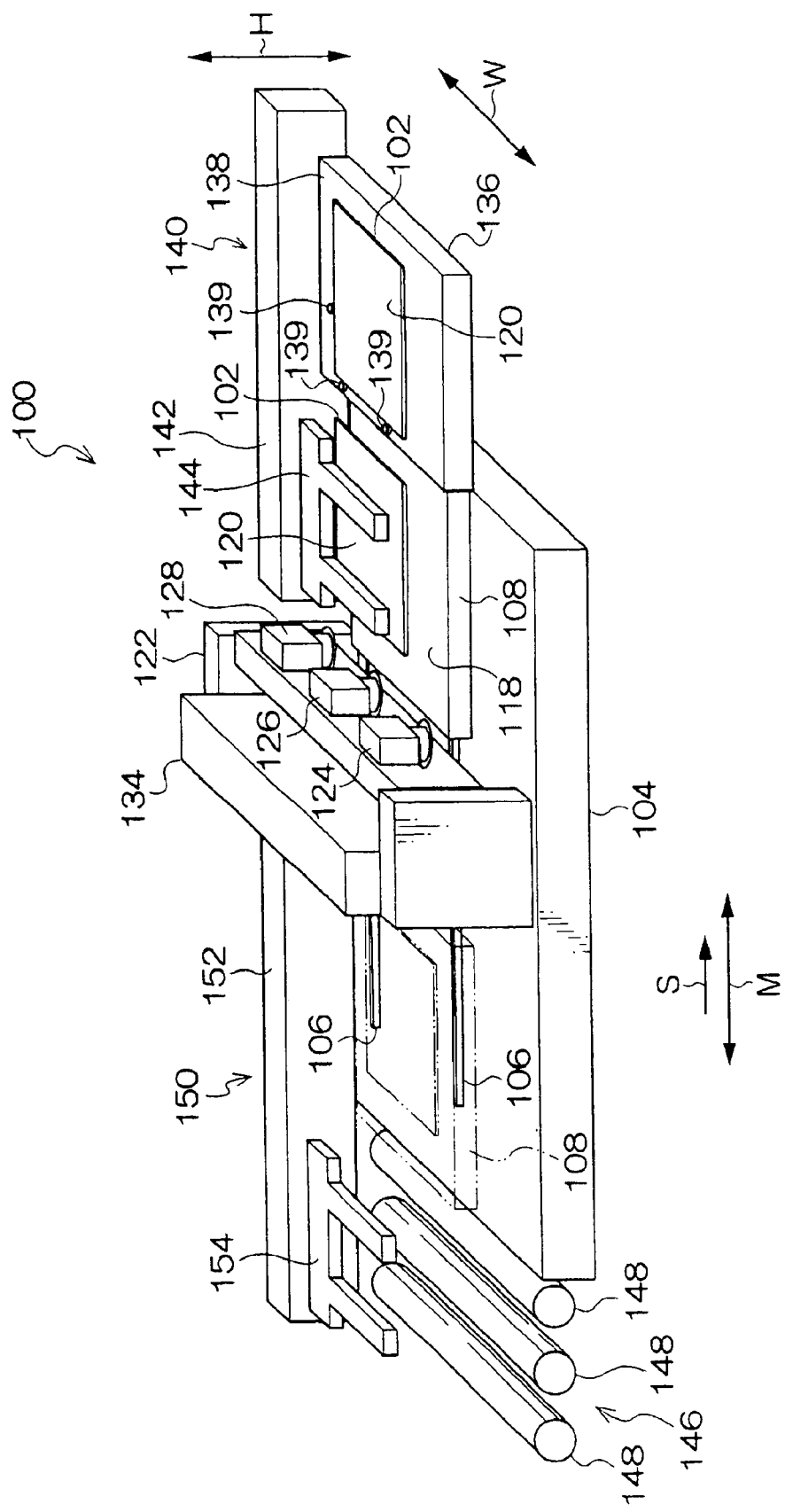
FIG. 1 is a perspective view showing external appearance of a laser exposure device relating to a first embodiment of the present invention.
Figure 2:
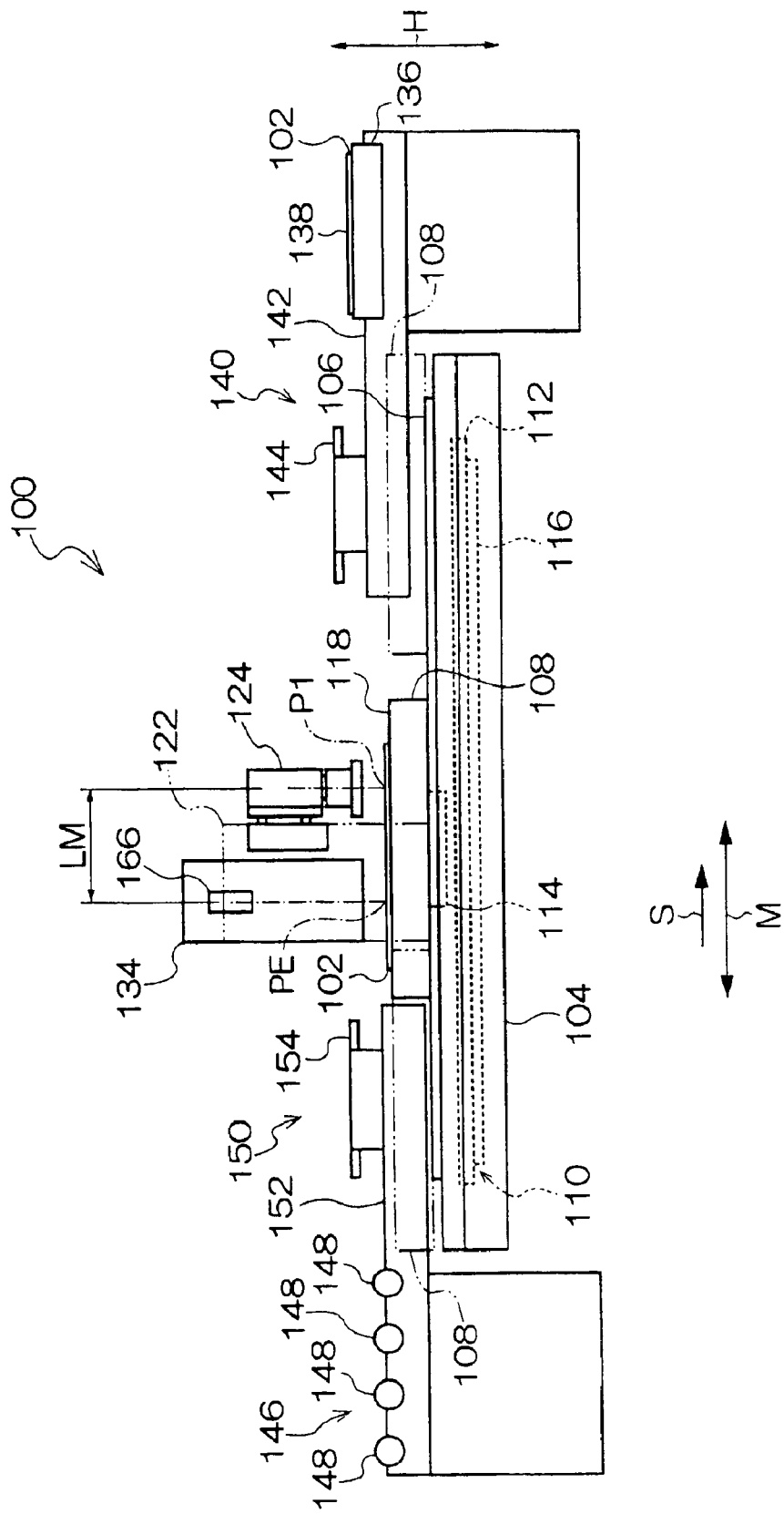
FIG. 2 is a side view showing the external appearance of the laser exposure device relating to the first embodiment of the present invention.

First Embodiment
  Structure of Laser Exposure Device
  FIGS. 1 and 2 show a laser exposure device 100 relating to a first embodiment of the present invention. This laser exposure device 100 exposes a thin plate-form substrate material 102, which is a printed circuit substrate material, with a laser beam B which is modulated in accordance with image data. Thus, an image (a latent image) corresponding to a wiring pattern of a printed circuit board is formed at the substrate material 102.

As shown in FIG. 1, the laser exposure device 100 is provided with a support platform 104, which is formed in a thick plate form. The support platform 104 is provided such that a surface form thereof has a substantially rectangular shape with a longitudinal direction aligned in a direction of scanning of the substrate material 102 (the direction of arrow S). A pair of guide rails 106, which extend straight in a stage movement direction (the direction of arrow M) parallel to the scanning direction are attached to an upper face portion of the support platform 104. A plate-form exposure stage 108 is disposed at the upper face portion of the support platform 104 with the pair of guide rails 106 between the exposure stage 108 and the support platform 104. The exposure stage 108 is supported by the guide rails 106 to be slideable along the stage movement direction between a predetermined entry position (a position shown by solid lines in FIG. 1) and exit position (a position shown by broken lines in FIG. 1).

As shown in FIG. 2, a linear motor 110 is disposed between the pair of guide rails 106 at the upper face portion of the support platform 104. A long, thin magnet 112 is provided along the stage movement direction at the linear motor 110. A plate-form coil 114, which is supported by the magnet 112 to be slideable in the stage movement direction, is also provided at the linear motor 110. Here, the coil 114 is attached to a lower face portion of the exposure stage 108, and moves along the stage movement direction integrally with the exposure stage 108. When the magnet 112 of the linear motor 110 is supplied with driving current and driving pulses by a transport control section 188 (see FIG. 20), which is described later, the magnet 112 exerts an electromagnetic driving force on the coil 114, and the coil 114 and the exposure stage 108 are moved (forward or backward) along the stage movement direction. A linear encoder 116 is provided at the linear motor 110. The linear encoder 116 outputs pulses to the transport control section 188 with a number proportional to a movement amount of the coil 114 along the stage movement direction, and a polarity corresponding to the movement direction.

As shown in FIG. 1, the upper face portion of the exposure stage 108 is made to serve as a flat surface-form placing face 118, at which the substrate material 102 is placed. Suction channels (not shown) for adsorbing the substrate material 102 by negative pressure are formed in the placing face 118. Negative pressure is supplied to these adsorption channels, by a vacuum generation device such as a vacuum pump or the like, when the substrate material 102 is placed on the placing face 118. As a result, the substrate material 102 placed on the placing face 118 is fixed on the placing face 118 in a tightly adhered state by the action of the negative pressure in the adsorption channels. An upper face portion of the substrate material 102 is made to serve as an exposure-receiving surface 120, at which a thin film-form photosensitive coating is formed of a photosensitive material. After formation of a latent image at this exposure-receiving surface 120 by the laser exposure device 100, a wiring pattern corresponding to the latent image is formed by the application of a predetermined treatment such as developing, etching or the like.

Further, a support gate 122, which is formed substantially in an 'n' shape opening downwards, is disposed so as to straddle the pair of guide rails 106 at a central vicinity of the upper face portion of the exposure stage 108. A gap through which the exposure stage 108 can pass is formed between the support gate 122 and the support platform 104. A plurality (three in the present embodiment) of CCD cameras 124, 126 and 128 are disposed at an end portion of the support gate 122 at an entry position side thereof. At these CCD cameras 124, 126 and 128, respective light-receiving elements are arrayed in straight lines along a width direction of the substrate material 102. The CCD cameras 124, 126 and 128 are provided with flashes 130 with extremely short light emission times for one cycle thereof, which serve as light sources at a time of image capture (see FIG. 20). Light-receiving sensitivities of the CCDs are set such that image capture is only possible at times of light emission by the flashes 130.

When the exposure stage 108 passes an image capture position PI directly below the CCD cameras 124, 126 and 128 (see FIG. 2), the flashes 130 emit light with predetermined timings. By receiving reflected light of the light from these flashes, image capture ranges which include alignment marks 132 at the substrate material 102 (see FIGS. 3A and 3B) are respectively captured. Here, image capture ranges of the CCD cameras 124, 126 and 128 are set to respectively different ranges along the width direction of the substrate material 102 (the direction of arrow W). Position adjustment of the CCD cameras 124, 126 and 128 along the width direction is possible in accordance with positions of the alignment marks 132 formed at the substrate material 102 (see FIGS. 3A and 3B) and the like, which are objects of image capture.

As shown in FIG. 1, a laser scanner 134 is disposed at the support gate 122, at an upstream side of the CCD cameras 124, 126 and 128 along the stage movement direction (the left side in FIG. 1). As shown in FIG. 2, the laser scanner 134 is provided with a casing accommodating an exposure head 166 and the like. When the substrate material 102 passes through an exposure position PE directly below the exposure head 166 (see FIG. 2), a plurality of laser beams B (see FIG. 2), which have been modulated on the basis of image data, are irradiated toward the exposure-receiving surface 120 of the substrate material 102, and an image (latent image) corresponding to the wiring pattern of the printed circuit board is formed at the exposure-receiving surface 120 of the substrate material 102.

Herein, the laser scanner 134 is supported by the support gate 122 to be position-adjustable along the scanning direction. Accordingly, a measurement distance LM, which is a separation between the imaging position PI according to the CCD cameras 124, 126 and 128 and the exposure position PE according to the laser scanner 134, is adjustable within a predetermined range. Specifically, the measurement distance LM is adjustable in a range from a maximum value which substantially corresponds to a length of the substrate material 102 along the scanning direction to a minimum value which substantially corresponds to a minimum pitch along the scanning direction of the alignment marks 132 formed at the substrate material 102.

As shown in FIG. 1, in the laser exposure device 100, a flat plate-form pre-alignment table 136 is disposed at a downstream side of the support platform 104 along the scanning direction (the right side in FIG. 1). An upper face portion of this pre-alignment table 136 serves as a flat surface-form placing face 138. Positioning protrusions 139 are provided at this placing face 138, for positioning the substrate material 102 at a predetermined placing position along the stage movement direction and the width direction. In the laser exposure device 100, after image formation has been completed, the exposure stage 108 returns from the exit position to the entry position, and another plate of the substrate material 102 is placed on the placing face 138 of the pre-alignment table 136 such that a leading end and one side of the substrate material 102 respectively abut against the positioning protrusions 139. Thus, the substrate material 102 is positioned at the placing position on the placing face 138 with a consistent positioning accuracy.

In the laser exposure device 100, an entry lifter 140 is provided for transporting the substrate material 102, which has been placed on the pre-alignment table 136, onto the exposure stage 108 at the entry position. The entry lifter 140 is equipped with a main body portion 142 and an arm portion 144. The arm portion 144 is supported by the main body portion 142 to be movable along the stage movement direction and a vertical direction (the direction of arrow H). A lower face of this arm portion 144 serves as an adsorption surface for the substrate material 102, in which a plurality of adsorption holes (not shown) are formed. A vacuum generation device such as a vacuum pump or the like is connected to the adsorption holes of the arm portion 144.

When the substrate material 102 has been placed on the pre-alignment table 136, the entry lifter 140 adsorbs this substrate material 102, using the arm portion 144, transports the substrate material 102 from on the pre-alignment table 136 to on the exposure stage 108, and places the substrate material 102 on the placing face 118 of the exposure stage 108. At this time, the entry lifter 140 causes a center of the exposure-receiving surface 120 and a center of the placing face 118 to coincide, and places the substrate material 102 at a predetermined reference position of the placing face 118 without causing an inclination of the substrate material 102 with respect to the stage movement direction. However, a slight positioning error of the substrate material 102 in relation to the reference position will inevitably occur, due to the effects of a positioning error when the substrate material 102 is placed on the pre-alignment table 136, a positioning error when the substrate material 102 is stopped at the entry position to the exposure stage 108, and the like.

As shown in FIG. 1, in the laser exposure device 100, a roller conveyor 146 is disposed at an upstream side of the support platform 104 along the scanning direction (the left side in FIG. 1). This roller conveyor 146 is equipped with a plurality of transport rollers 148, which are arranged along the stage movement direction, and a driving section (not shown) which rotates these transport rollers 148. When the substrate material 102 is placed at the support platform 104 side end portion of the roller conveyor 146, the roller conveyor 146 transports the substrate material 102, using the plurality of transport rollers 148, away from the support platform 104 in an exit direction and transports this substrate material 102 to a stacking tray or the like for temporary holding.

Further, in the laser exposure device 100, an exit lifter 150 is provided at the exit position for transporting the substrate material 102 that has been placed on the exposure stage 108 onto the roller conveyor 146. The exit lifter 150, similarly to the entry lifter 140, is provided with a main body portion 152 and an arm portion 154, which is supported by the main body portion 152 to be movable along the stage movement direction and the vertical direction (the direction of arrow H). The lower face of the arm portion 154 serves as an adsorption surface for the substrate material 102, in which a plurality of adsorption holes (not shown) are formed, and a vacuum generation device such as a vacuum pump or the like is connected to the adsorption holes of the arm portion 154. When the exposure stage 108 on which the substrate material 102 has been placed reaches the exit position, the exit lifter 150 adsorbs the substrate material 102 on the exposure stage 108, using the arm portion 154, transports the substrate material 102 from on the exposure stage 108 to on the roller conveyor 146, and places the substrate material 102 on the end portion of the roller conveyor 146. In accordance therewith, the roller conveyor 146 commences transport of the substrate material 102 in the exit direction.

Figure 3:
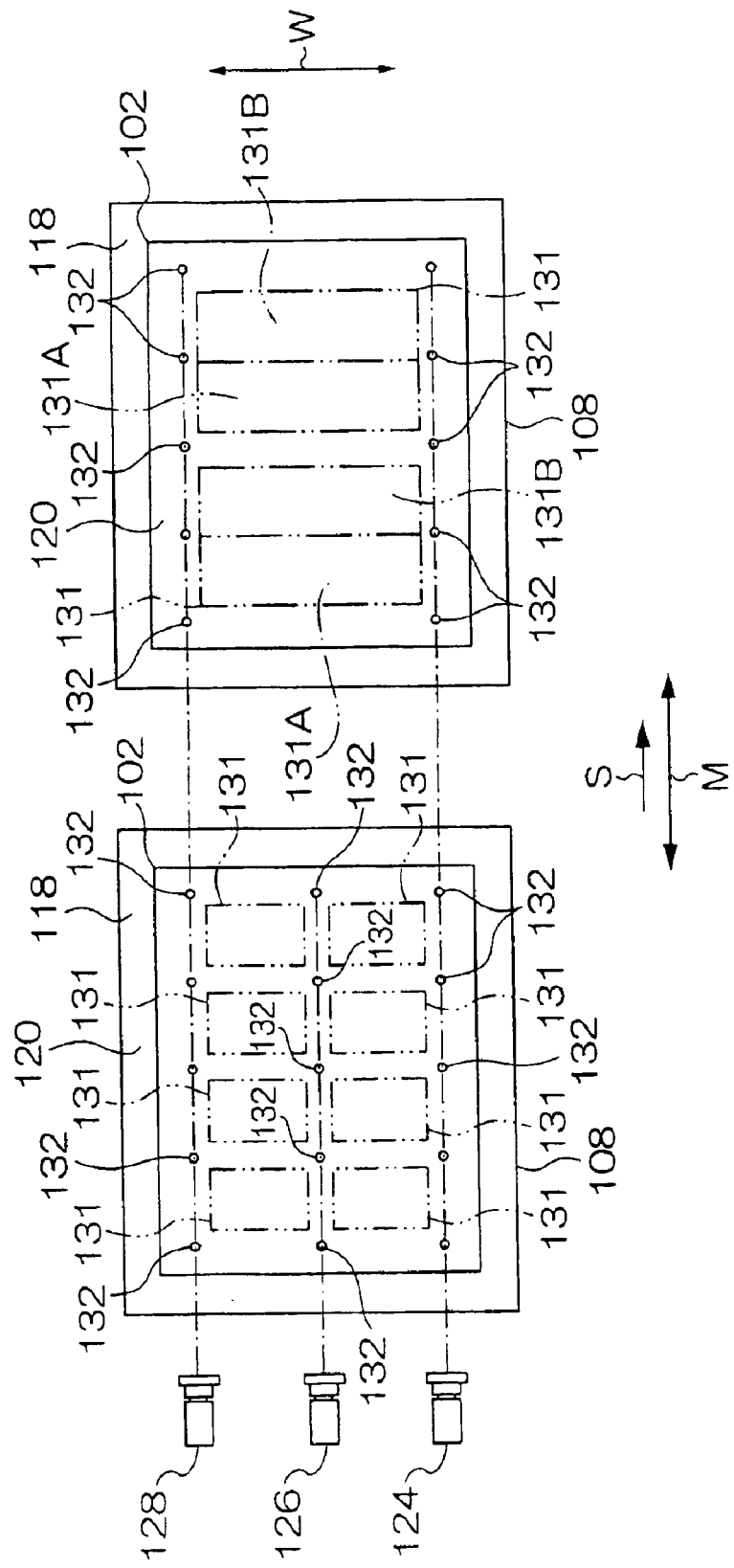
FIG. 3A is a plan view showing the external appearance of the laser exposure device relating to the first embodiment of the present invention.
FIG. 3B is a plan view showing the external appearance of the laser exposure device relating to the first embodiment of the present invention.

As shown in FIGS. 3A and 3B, on the substrate material 102, a plurality of imaging regions 131 are provided at the exposure-receiving surface 120 in advance. The plurality of imaging regions 131 form latent images corresponding to wiring patterns. In addition, a plurality of sets of alignment marks 132 are formed to respectively correspond to the plurality of imaging regions 131. At the substrate material 102 illustrated in FIG. 3A, positions of the imaging regions 131 and alignment marks 132 are illustrated for a case in which eight printed circuit boards with comparatively small surface areas are to be produced from one plate of the substrate material 102. With this substrate material 102 as illustrated in FIG. 3A, the imaging regions 131, which respectively correspond one-to-one with single printed circuit boards, are set in two rows along the width direction and four columns along the scanning direction. The alignment marks 132 are formed to have predetermined spacings at outer sides of corner portions of the imaging regions 131.

At the substrate material 102 shown in FIG. 3B, positions of the imaging regions 131 and alignment marks 132 are illustrated for a case of producing two printed circuit boards with relatively large areas from one plate of the substrate material 102. With the substrate material 102 illustrated in FIG. 3B, the imaging regions 131, which respectively correspond one-to-one with single printed circuit boards, are set in one row along the width direction and two columns along the scanning direction. The alignment marks 132 are formed to have predetermined spacings at outer sides of respective corner portions of the imaging regions 131, and are formed to have predetermined spacings at outer sides of center points of edges of the imaging regions 131 along the scanning direction.

Here, the imaging regions 131 shown in FIG. 3B are each divided along the scanning direction into two sub-regions 131A and 131B, with the positions of the alignment marks 132 that are formed at the outer sides of the edge portions of the imaging regions 131 serving as reference positions therefor. Note that, although the alignment marks 132 of the present embodiment are formed by providing circular through-holes or depressions in the exposure-receiving surface 120 of the substrate material 102, land areas or the like, formed at the exposure-receiving surface 120 in advance, could also serve as alignment marks.

Next, the laser scanner 134 that is employed in the laser exposure device 100 relating to the present embodiment will be described in detail. As shown in FIGS. 7 and 8B, the laser scanner 134 is equipped with a plurality (for example, fourteen) of exposure heads 166, which are arranged substantially in a matrix pattern with m rows and n columns (for example, three rows by five columns). In this example, with consideration to width of the substrate material 102, four of the exposure heads 166 are provided in the third row. Note that when an individual exposure head which is arranged in the m-th row and the n-th column is to be referred to, that exposure head is denoted as exposure head $166_{mn}$.

Exposure areas 168 corresponding to the exposure heads 166 have rectangular shapes with short sides thereof aligned in the scanning direction (see the arrow). Consequently, in accordance with progress of the exposure stage 108 along the stage movement direction (movement in the direction of arrow M) and relative movement of the substrate material 102 in the scanning direction, band-form exposed regions 170 are formed on the substrate material 102 at the respective exposure heads 166. Note that when an exposure area formed by an individual exposure head, which is arranged in the m-th row and the n-th column, is to be referred to, that exposure area is denoted as exposure area $168_{mn}$.

Figure 8A:
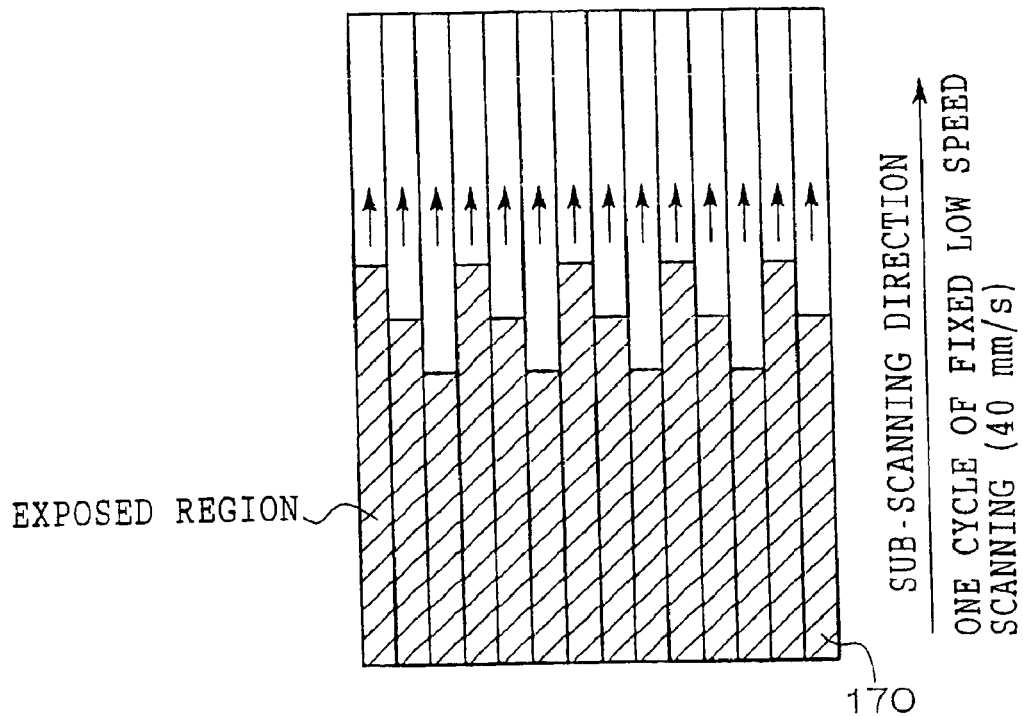
FIG. 8A is a plan view showing exposed regions formed at a photosensitive material.
Figure 8B:
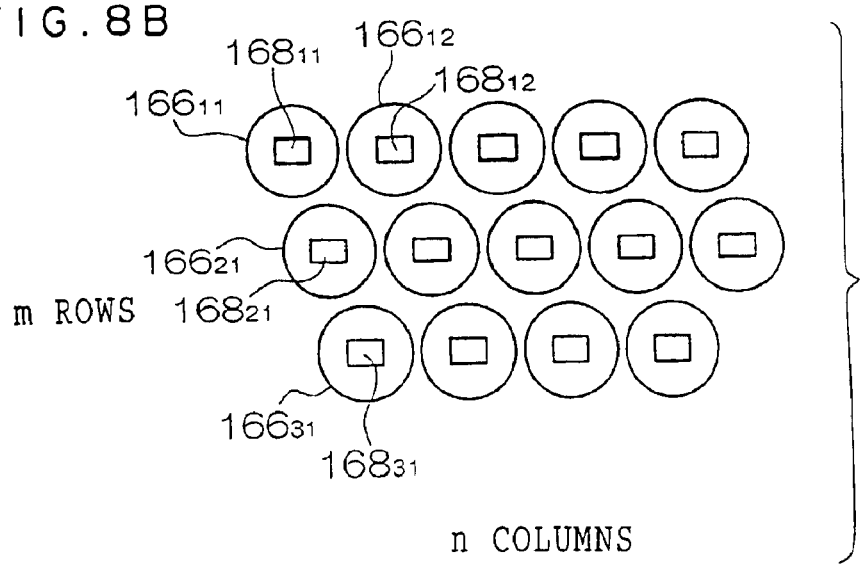
FIG. 8B is a view showing an arrangement of exposure areas due to respective exposure heads.

As shown in FIGS. 8A and 8B, in each row, the respective exposure heads, which are arranged in a line, are disposed to be offset by a predetermined interval in a row arrangement direction (which interval is an integer multiple (two in the present embodiment) of the long dimension of the exposure areas), such that the band-form exposed regions 170 will be lined up without gaps therebetween in a direction intersecting a sub-scanning direction. Thus, a portion that cannot be exposed between exposure area $168_{11}$ and exposure area $168_{12}$ of the first row can be exposed by exposure area $168_{21}$ of the second row and exposure area $168_{31}$ of the third row.

Figure 9:
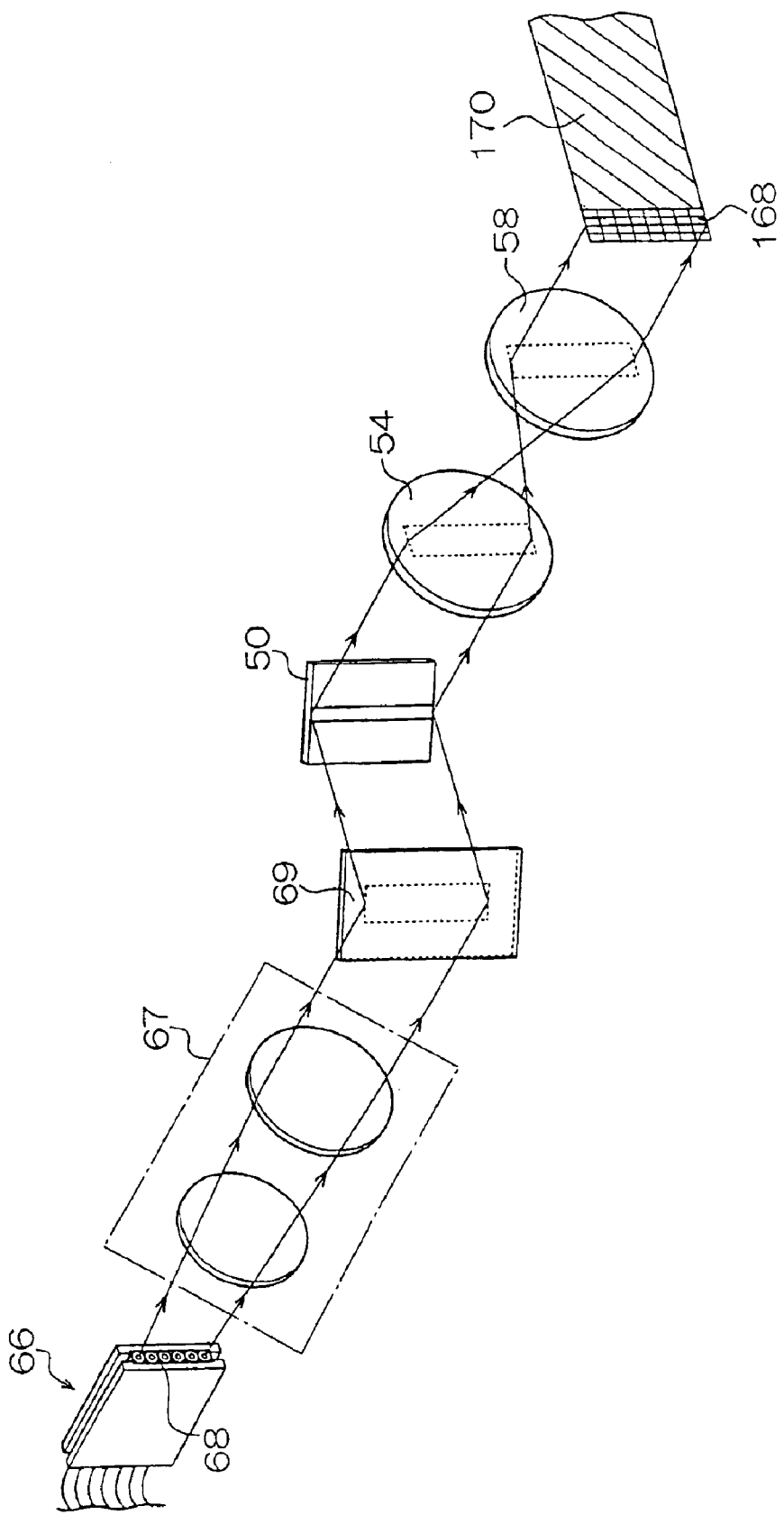
FIG. 9 is a perspective view showing general structure of an exposure head of a laser exposure device relating to an embodiment of the present invention.
Figure 10A:
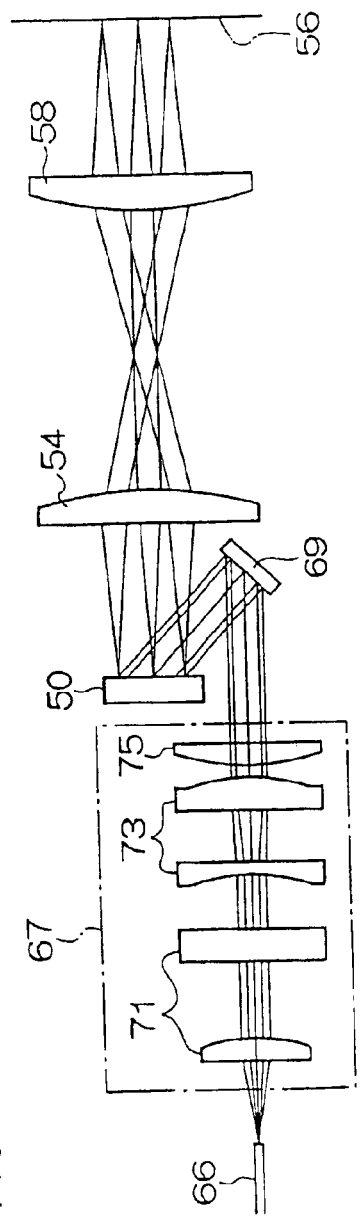
FIG. 10A is a sectional view, cut in a sub-scanning direction along an optical axis, which shows structure of the exposure head shown in FIG. 9.
Figure 10B:
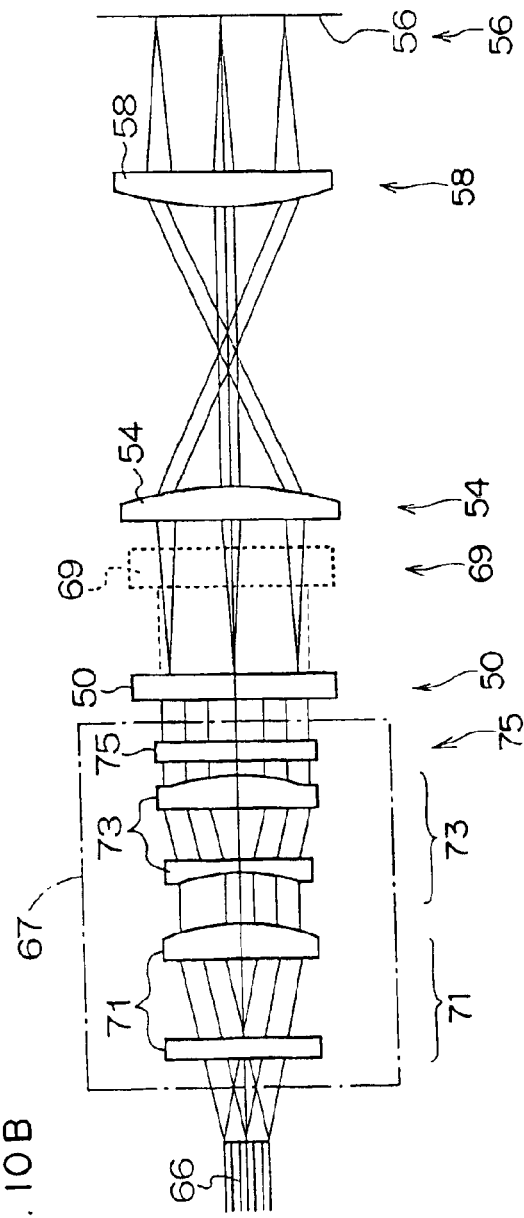
FIG. 10B is a side view of FIG. 10A.

As shown in FIGS. 9, 10A and 10B, at each of the exposure areas $166_{11}$ to $166_{mn}$, a digital micromirror device (DMD) 50 is provided to serve as a spatial modulation element for modulating incident light beams at respective pixels in accordance with the image data.

An image data processing section and a mirror driving control section are incorporated in a scanner control section 192, which controls driving of the laser scanner 134, as shown in FIG. 20. At the image data processing section, on the basis of image data inputted from a controller 190, driving signals are generated for driving control of each micromirror in a region of the DMD 50 at the corresponding exposure head 166 which region is to be controlled. The regions that are to be controlled are described later. The mirror driving control section controls an angle of each micromirror of the DMD 50 at the corresponding exposure head 166, on the basis of the control signals generated at the image data processing section. Control of the angles of these reflection surfaces is described later.

As shown in FIGS. 9, 10A and 10B, a fiber array light source 66, a lens system 67 and a mirror 69 are disposed in this order at a light incidence side of the DMD 50. The fiber array light source 66 is equipped with a laser emission portion at which emission end portions (light emission points) of optical fibers are arranged in a row along a direction corresponding to the direction of the long sides of the exposure area 168. The lens system 67 corrects laser light that is emitted from the fiber array light source 66, and focuses the light on the DMD 50. The mirror 69 reflects the laser light that has been transmitted through the lens system 67 toward the DMD 50.

The lens system 67 is structured with a single pair of combination lenses 71, which make the laser light that has been emitted from the fiber array light source 66 parallel, a single pair of combination lenses 73, which correct the laser light that has been made parallel such that a light amount distribution is more uniform, and a condensing lens 75 which focuses the laser light whose light amount distribution has been corrected on the DMD. The combination lenses 73 have the functions of, in the direction of arrangement of the laser emission ends, broadening portions of light flux that are close to an optical axis of the lenses and constricting portions of the light flux that are distant from the optical axis, and in a direction intersecting this direction of arrangement, transmitting the light unaltered. Thus, the laser light is corrected such that the light amount distribution is uniform.

Lens systems 54 and 58 are disposed at a light reflection side of the DMD 50. The lens systems 54 and 58 focus the laser light that has been reflected at the DMD 50 on the exposure-receiving surface 120 of the substrate material 102. The lens systems 54 and 58 are disposed such that the DMD 50 and an exposure-receiving surface 56 have a conjugative relationship.

Figure 11:
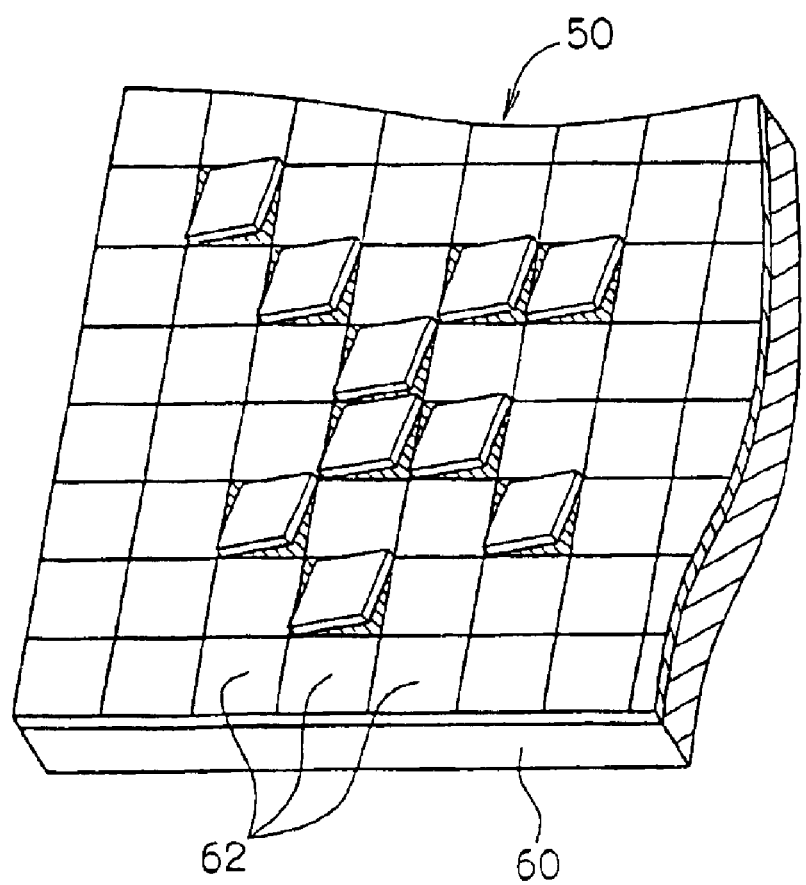
FIG. 11 is a partial enlarged view showing structure of a digital micromirror device (DMD).

As shown in FIG. 11, at the DMD 50, very small mirrors (micromirrors) 62, which are supported by support columns, are disposed on an SRAM cell (memory cell) 60. The DMD 50 is a mirror device which is constituted of a large number (for example, 600 by 800) of these extremely small mirrors, which structure image elements (pixels), arranged in a checkerboard pattern. At each pixel, the micromirror 62 is provided so as to be supported at an uppermost portion of the support column. A material with high reflectivity, such as aluminium or the like, is applied by vapor deposition at a surface of the micromirror 62. Here, the reflectivity of the micromirror 62 is at least 90%. The SRAM cell 60 with CMOS silicon gates, which is produced by a conventional semiconductor memory production line, is disposed directly under the micromirror 62, with the support column, which includes a hinge and a yoke, interposed therebetween. The whole of this structure is monolithic (an integrated form).

Figure 12A:
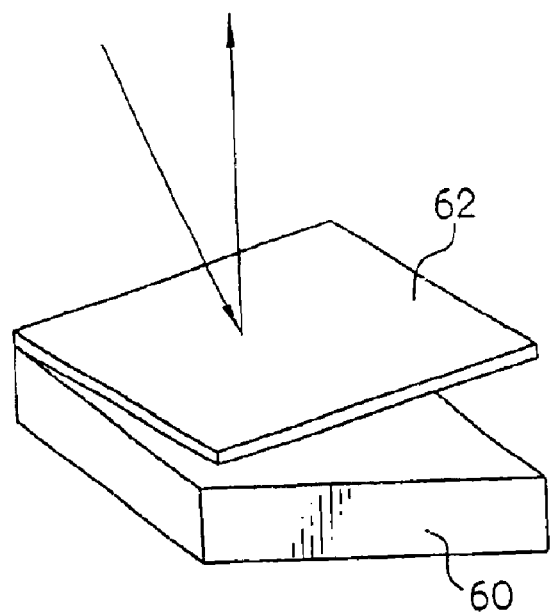
FIGS. 12A and 12B are explanatory views for explaining operation of the DMD.
Figure 12B:
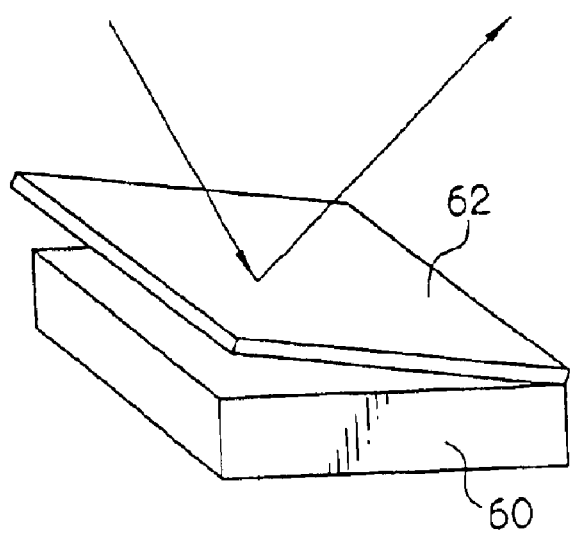

When digital signals are written to the SRAM cell 60 of the DMD 50, the micromirrors 62 supported at the support columns are inclined, about a diagonal, within a range of $\pm\alpha°$ (for example, $\pm10°$), relative to the side of the substrate on which the DMD 50 is disposed. FIG. 12A shows a state in which the micromirror 62 is inclined at $+\alpha°$, which is an 'ON' state, and FIG. 12B shows a state in which the micromirror 62 is inclined at $-\alpha°$, which is an 'OFF' state. Accordingly, as a result of control of the inclinations of the micromirrors 62 at the pixels of the DMD 50 in accordance with image signals, as shown in FIG. 11, light that is incident at the DMD 50 is reflected in directions of inclination of the respective micromirrors 62.

FIG. 11 shows a portion of the DMD 50 enlarged, and shows an example of a state in which the micromirrors 62 are controlled to $+\alpha°$ and $-\alpha°$. The ON-OFF control of the respective micromirrors 62 is carried out by the scanner control section 192, which receives instructions from the controller 190. A light-absorbing body (which is not shown) is disposed in the direction in which light beams are reflected by the micromirrors 62 that are in the OFF state.

Figure 13B:
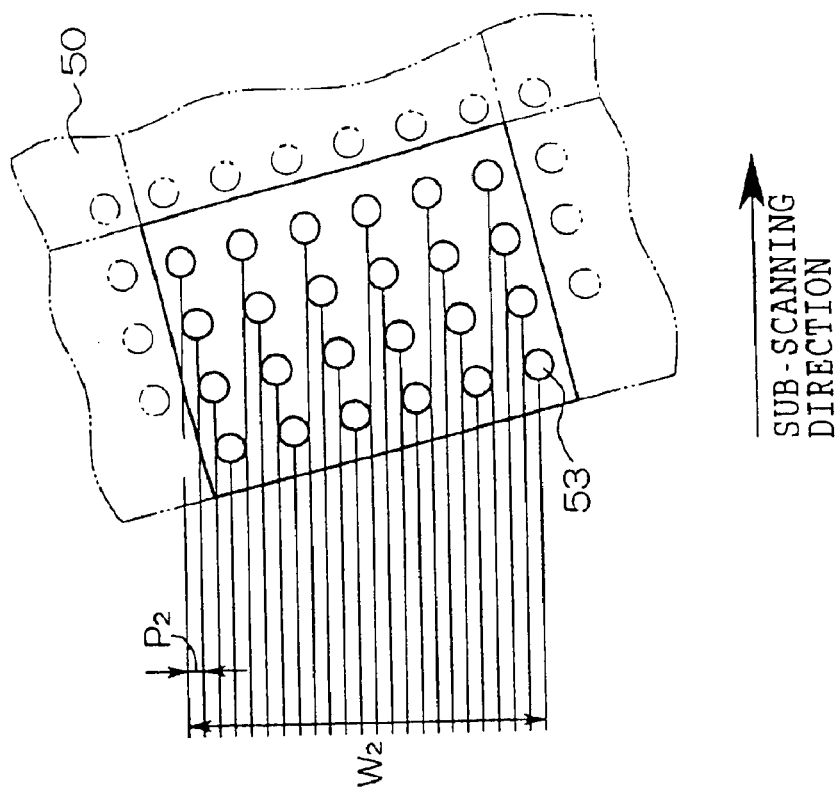
FIG. 13B is a plan view comparatively showing positions of exposure beams and scanning lines in a case in which the DMD is disposed at an angle.
Figure 13A:
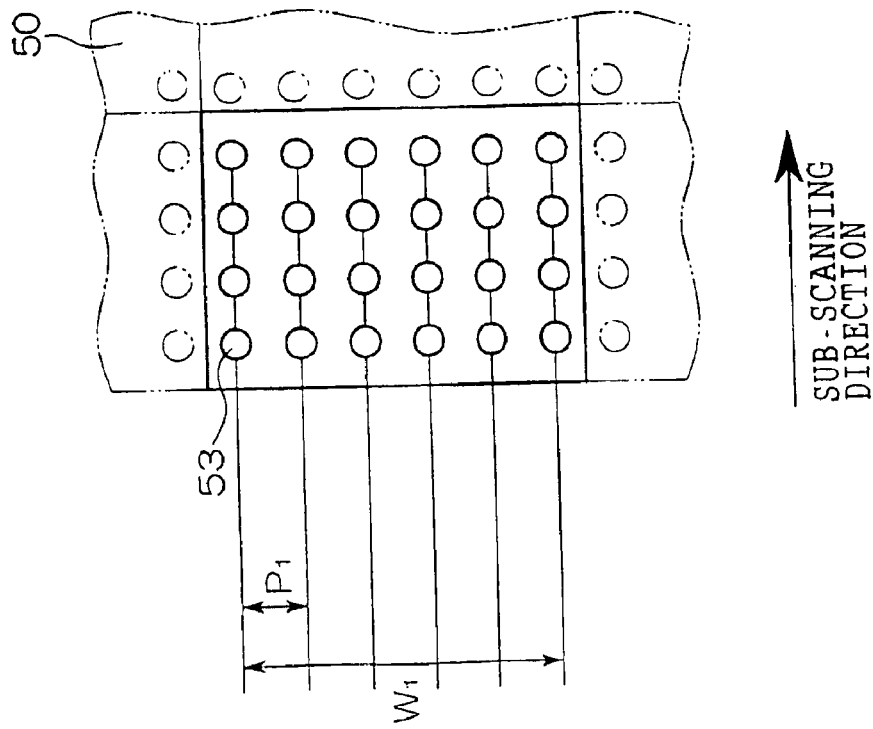
FIG. 13A is a plan view comparatively showing positions of exposure beams and scanning lines in a case in which the DMD is not disposed at an angle.

It is preferable if the DMD 50 is disposed to be slightly angled, such that a short side thereof forms a predetermined angle $\theta$ (for example, 1° to 5°) with the sub-scanning direction. FIG. 13A shows scanning tracks of reflected light images (exposure beams) 53 formed by the micromirrors in a case in which the DMD 50 is not angled. FIG. 13B shows scanning tracks of the exposure beams 53 in the case in which the DMD 50 is angled.

At the DMD 50, a large number (for example, 800) of the micromirrors are arranged in a long side direction to form a micromirror row, and a large number (for example, 600) of these micromirror rows are arranged in a short side direction. As shown in FIG. 13B, when the DMD 50 is angled, a pitch $P_2$ of scanning paths (scanning lines) of the exposure beams 53 from the micromirrors is tighter than a pitch $P_1$ of scanning lines in the case in which the DMD 50 is not angled. Thus, resolution can be greatly improved. However, because the angle of the angling of the DMD 50 is very small, a scanning width $W_2$ in the case in which the DMD 50 is angled is substantially the same as a scanning width $W_1$ in the case in which the DMD 50 is not angled.

The same scanning line will substantially be superposingly exposed by different micromirror rows. Consequently, by this superposing exposure, exposure positions can be controlled in very fine amounts, and high accuracy exposure can be implemented. Further, by control in very fine amounts of exposure positions at boundary lines between the plurality of exposure heads arranged in a main scanning direction, joins without steps can be formed.

Instead of angling the DMD 50, the micromirrors may be disposed in a staggered pattern in which the micromirror rows are shifted by predetermined intervals in the direction intersecting the sub-scanning direction, and the same effects can be obtained.

As shown in FIG. 14A, the fiber array light source 66 is equipped with a plurality (for example, six) of laser modules 64. At each of the laser modules 64, one end of a multi-mode optical fiber 30 is connected. At the other end of the multi-mode optical fiber 30, an optical fiber 31, whose core diameter is the same as that of the multi mode optical fiber 30 and whose cladding diameter is smaller than that of the multi-mode optical fiber 30, is connected. As shown in FIG. 14C, emission end portions of the multi-mode optical fibers 31 (light emission points) are arranged in a single row along the main scanning direction, which intersects the sub-scanning direction, to structure a laser emission portion 68. Note that the light emission points may be arranged in two rows along the main scanning direction, as shown in FIG. 14D.

As is shown in FIG. 14B, the emission end portions of the optical fibers 31 are interposed and fixed between two support plates 65, which have flat faces. Furthermore, a transparent protective plate 63, of glass or the like, is disposed at the light emission side of the optical fibers 31 in order to protect end faces of the optical fibers 31. The protective plate 63 may be disposed to be closely contacted with the end faces of the optical fibers 31, and may be disposed such that the end faces of the optical fibers 31 are sealed. The emission end portions of the optical fibers 31 have high optical density, tend to attract dust, and are susceptible to deterioration. However, by disposing the protective plate 63 thus, adherence of dust to the end faces can be prevented and deterioration can be slowed.

In the example of FIG. 14B, in order that the emission ends of the optical fibers 31 with smaller cladding diameters are arranged in a single row without gaps therebetween, some of the multi-mode optical fibers 30 are piled up on and between the adjacent two of the multi-mode optical fibers 30 at the section with larger cladding diameters. The emission end of each optical fiber 31 that is joined to one of the multi-mode optical fibers 30 that are piled up is arranged so as to be sandwiched between the two emission ends of the multi-mode optical fibers 31 that are joined to the two multi-mode optical fibers 30 which are adjacent at the section with larger cladding diameters.

Figure 15:
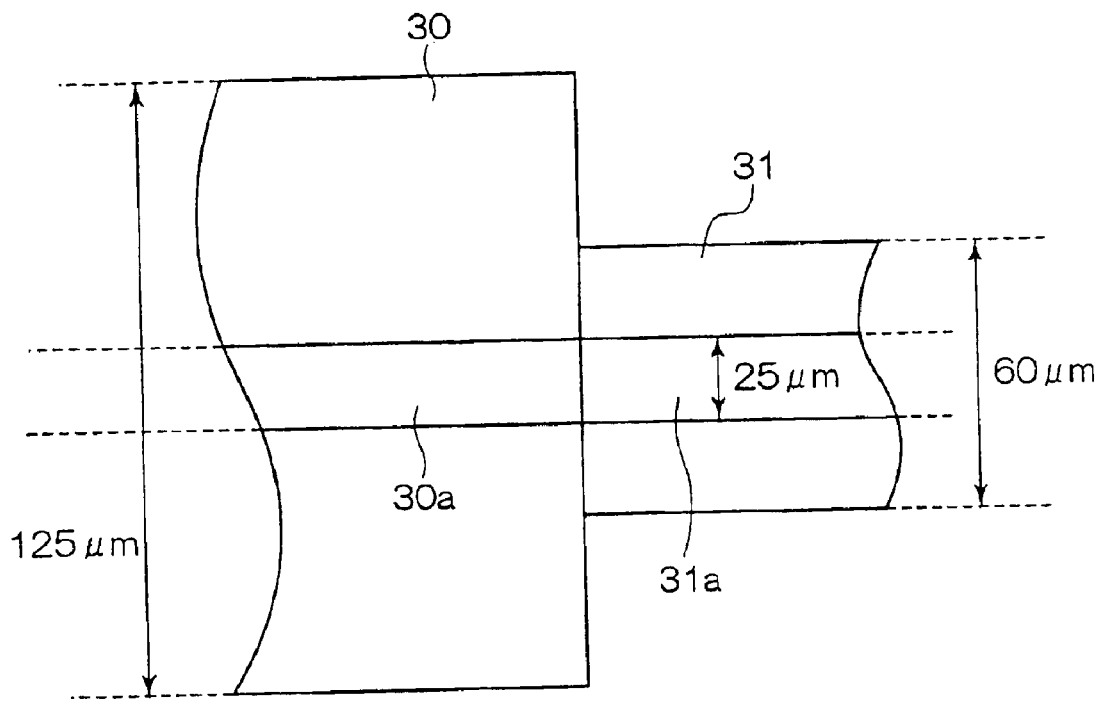
FIG. 15 is a view showing structure of a multi-mode optical fiber.

These optical fibers can be obtained by, for example, as shown in FIG. 15, coaxially joining a 1 to 30 cm length of the optical fiber 31 with the smaller cladding diameter to a distal end portion, at the laser light emission side, of the multi-mode optical fiber 30 with the larger cladding diameter. The two optical fibers 30 and 31 are joined by fusing an incidence end face of the optical fiber 31 to an emission end face of the multi-mode optical fiber 30 such that central axes of the two fibers coincide. As described above, a diameter of a core 31a of the optical fiber 31 has the same magnitude as a diameter of a core 30a of the multi-mode optical fiber 30.

Further, a short optical fiber, at which the optical fiber whose cladding diameter is smaller is fused to an optical fiber whose length is short and whose cladding diameter is larger, may be joined at the emission end of the multi-mode optical fiber 30 via a ferrule, an optical connector or the like. Because this joining is carried out with the connector or the like so as to be detachable, replacement of a distal end portion, in a case in which the optical fiber whose cladding diameter is smaller has been damaged or the like, is simple, and costs required for maintenance of the exposure head can be reduced. Herebelow, the optical fiber 31 may on occasion be referred to as an exposure end portion of the multi-mode optical fiber 30.

As the multi-mode optical fiber 30 and the optical fiber 31, any of step index-type optical fibers, graded index-type optical fibers and multiplex-type optical fibers can be used. For example, a step index-type optical fiber produced by Mitsubishi Cable Industries, Ltd. could be used. In the present embodiment, the multi-mode optical fiber 30 and the optical fiber 31 are step index-type optical fibers. The multi-mode optical fiber 30 has cladding diameter=125 $\mu$m, core diameter=25 $\mu$m, NA=0.2, and transmittance of an incidence end face coating=99.5% or more. The optical fiber 31 has cladding diameter=60 $\mu$m, core diameter=25 $\mu$m, and NA=0.2.

Figure 16:
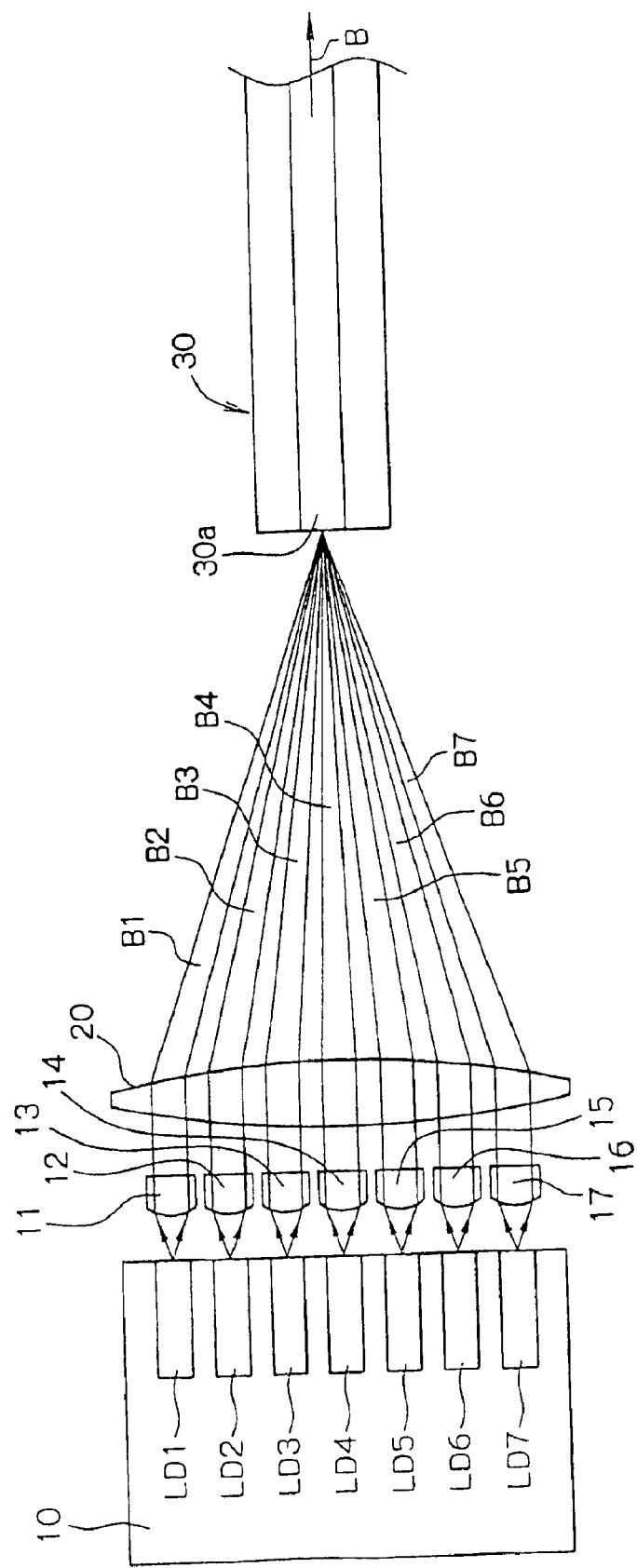
FIG. 16 is a plan view showing structure of a multiplex laser light source.

The laser module 64 is structured by a multiplexed laser light source (fiber light source) shown in FIG. 16. This multiplex laser light source is structured with a plurality (for example, seven) of chip-form lateral multi-mode or single-mode UV-type semiconductor lasers LD1, LD2, LD3, LD4, LD5, LD6 and LD7, collimator lenses 11, 12, 13, 14, 15, 16 and 17, a single condensing lens 20, and one of the multi-mode optical fibers 30. The UV-type semiconductor lasers LD1 to LD7 are fixedly arranged on a heat block 10. The collimator lenses 11 to 17 are provided in correspondence with the UV-type semiconductor lasers LD1 to LD7, respectively. The UV-type semiconductor lasers LD1 to LD7 all have the same oscillation wavelengths and maximum outputs. Note that the number of semiconductor lasers is not limited to seven.

Figure 17:
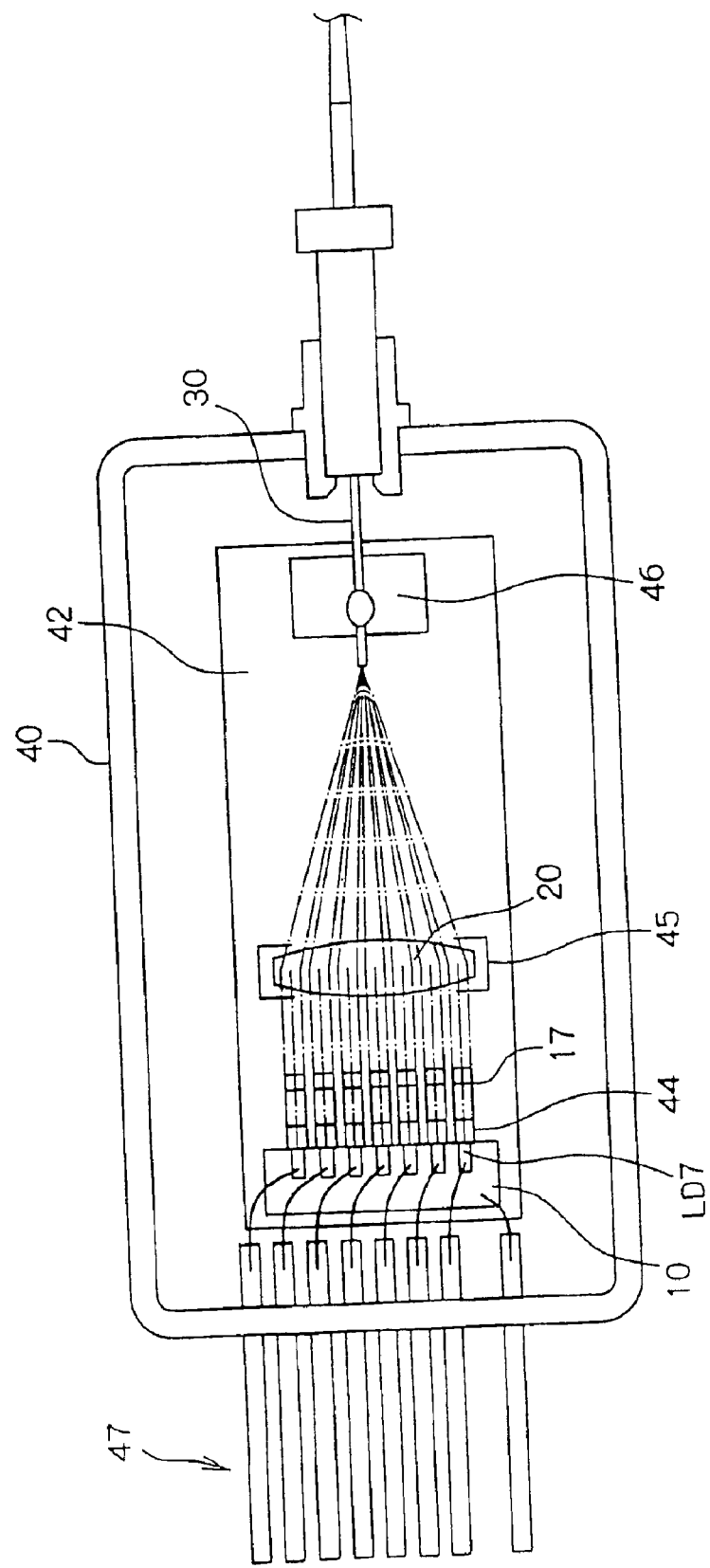
FIG. 17 is a plan view showing structure of a laser module.
Figure 18:
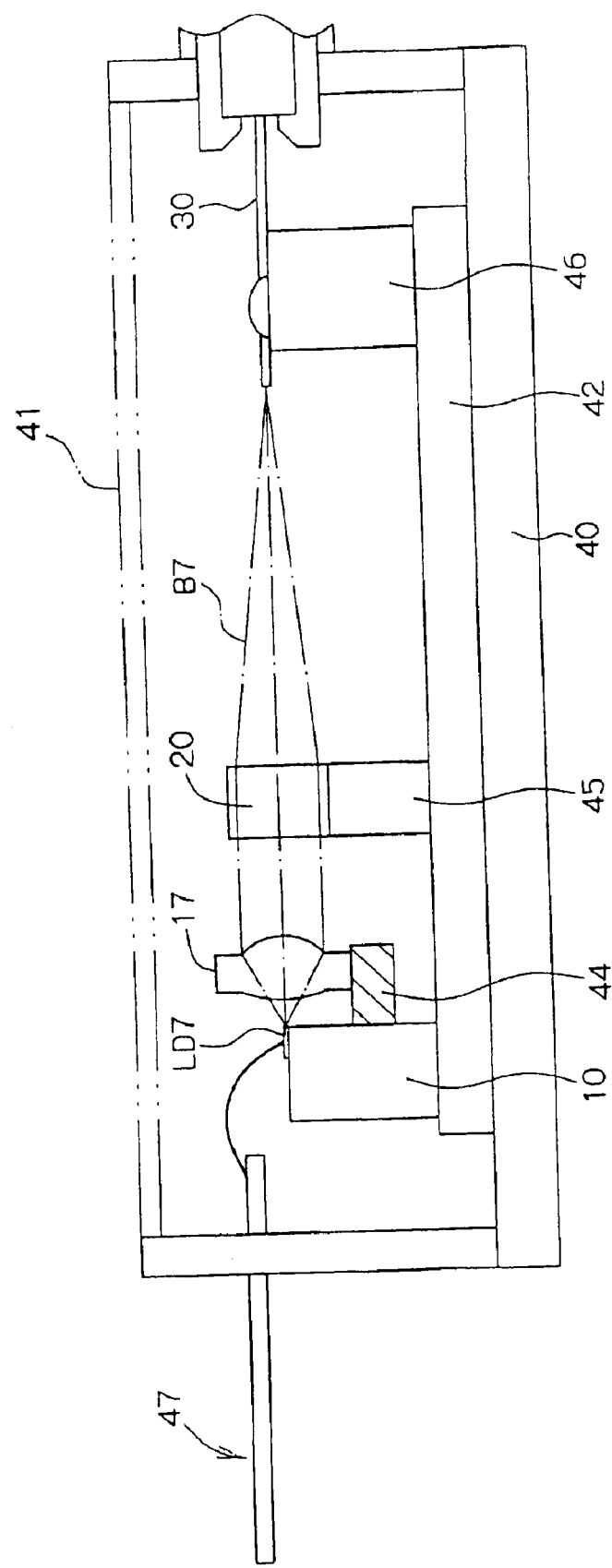
FIG. 18 is a side view showing structure of the laser module shown in FIG. 17.

As shown in FIGS. 17 and 18, the above-described multiplex laser light source, together with other optical elements, is accommodated in a box-like package 40, which opens upward. The package 40 is provided with a package lid 41 prepared so as to close this opening of the package 40. After an air removal treatment, sealed gas is introduced and the opening of the package 40 is closed by the package lid 41. Thus, the above-described multiplex laser light source is hermetically sealed in a closed space (sealed space) formed by the package 40 and the package lid 41.

A baseplate 42 is fixed at a lower face of the package 40. The heat block 10, a condensing lens holder 45 and a fiber holder 46 are attached at an upper face of the baseplate 42. The condensing lens holder 45 holds the condensing lens 20. The fiber holder 46 holds an incidence end portion of the multi-node optical fiber 30. An opening is formed in a wall face of the package 40. The emission end portion of the multi-mode optical fiber 30 is led out through this opening to outside the package.

A collimator lens holder 44 is attached at a side face of the heat block 10, and holds the collimator lenses 11 to 17. Openings are formed in a lateral wall face of the package 40. Wiring 47, which supplies driving current to the UV-type semiconductor lasers LD1 to LD7, is passed through these openings and led out to outside the package 40.

Note that in FIG. 18, in order to alleviate complexity of the drawing, only the UV-type semiconductor laser LD7, of the plurality of UV-type semiconductor lasers, is marked with a reference numeral, and only the collimator lens 17, of the plurality of collimator lenses, is marked with a reference numeral.

Figure 19:
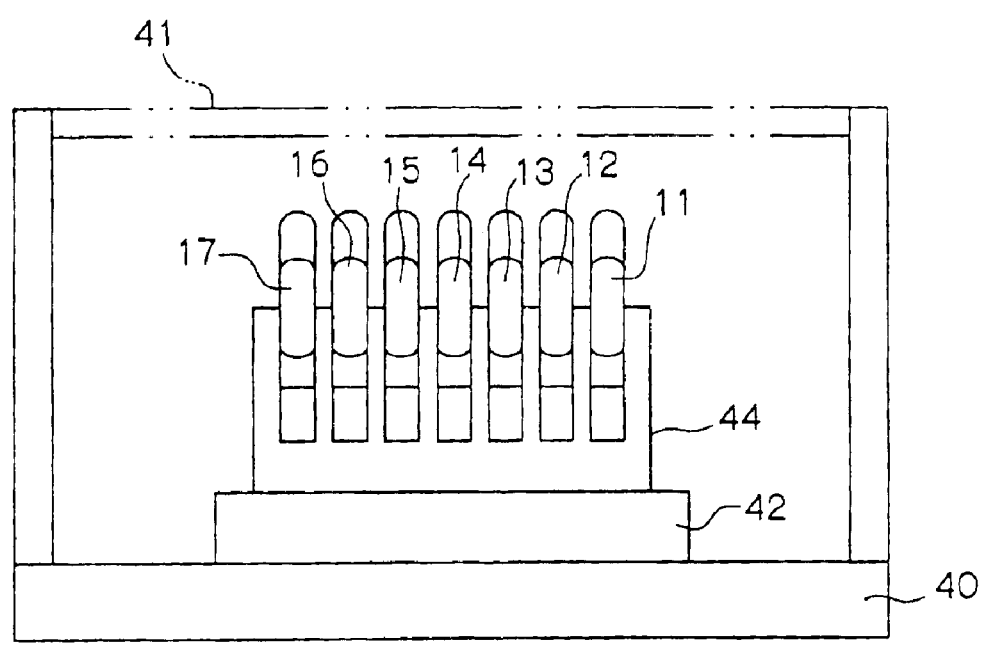
FIG. 19 is a partial elevational view showing structure of the laser module shown in FIG. 17.

FIG. 19 shows the collimator lenses 11 to 17 and mounting portions thereof, as viewed from front faces thereof. Each of the collimator lenses 11 to 17 is formed in a long, narrow, cut-down shape with parallel flat faces (which shape would be obtained by cutting, with the parallel flat faces, a circular-form lens which is provided with an aspherical surface) defining a region that includes an optical axis of the circular-form lens. The collimator lenses with this long, narrow shape may be formed, for example, by molding-formation of resin or optical glass. The collimator lenses 11 to 17 are closely disposed in a direction of arrangement of light emission points of the UV-type semiconductor lasers LD1 to LD7 (the left-right direction in FIG. 19) such that the length directions of the collimator lenses 11 to 17 cross the direction of arrangement of the light emission points.

As the UV-type semiconductor lasers LD1 to LD7, lasers may be employed which are provided with an active layer with a light emission width of 2 $\mu$m, and which respectively emit laser beams B1 to B7 in forms which widen at angles of, for example, 10° and 30° with respect, respectively, to a direction parallel to the active layers and a direction perpendicular to the active layers. These UV-type semiconductor lasers LD1 to LD7 are disposed such that the light emission points are lined up in a single row in the direction parallel to the active layers.

Accordingly, the laser beams B1 to B7 emitted from the respective light emission points are incident, respectively, on the collimator lenses 11 to 17 having the long, narrow forms described above, in states in which the direction for which the spreading angle of the beam is greater coincides with the length direction of the lens and the direction in which the spreading angle is smaller coincides with a width direction (a direction intersecting the length direction). Specifically, the width of each of the collimator lenses 11 to 17 is 1.1 mm and the length thereof is 4.6 mm, and the laser beams B1 to B7 incident thereat have beam diameters in the horizontal direction and the vertical direction of 0.9 mm and 2.6 mm, respectively. Further, each of the collimator lenses 11 to 17 has a focusing length $f_1$=3 mm, NA=0.6 and lens arrangement pitch=1.25 mm.

The condensing lens 20 is cut away in a long, narrow, cut-down shape with parallel flat faces (which shape would be obtained by cutting, with the parallel flat faces, a circular-form lens which is provided with an aspherical surface) defining a region that includes an optical axis of the circular-form lens. The condnesing lens 20 is formed in a shape which is long in the direction of arrangement of the collimator lenses 11 to 17 (i.e., the horizontal direction) and short in a direction perpendicular thereto. The condensing lens 20 has a focusing distance $f_2$=23 mm and NA=0.2. The condensing lens 20 is also formed by, for example, molding-formation of resin or optical glass.

Next, structure of a control system of the laser exposure device 100 will be described. As shown in FIG. 20, the laser exposure device 100 is equipped with the controller 190, for controlling the device as a whole. The transport control section 188, an image processing section 194 and the scanner control section 192 are respectively connected to the controller 190.

The transport control section 188 is connected to the linear motor 110 and linear encoder 116 which are linked to the exposure stage 108. The transport control section 188 outputs driving pulse signals to the linear motor 110 during movement of the exposure stage 108. At this time, the transport control section 188 performs feedback control of the linear motor 110 on the basis of the pulse signals from the linear encoder 116. The image processing section 194 processes image signals from the CCD cameras 124, 126 and 128, and outputs positional data, corresponding to positions of the alignment marks 132 whose ranges have been imaged by the CCD cameras 124, 126 and 128, to the controller 190. The scanner control section 192 controls the laser scanner 134 on the basis of scanner driving signals from the controller 190 and image signals corresponding to the wiring patterns.

Next, operation of the laser exposure device 100 relating to the present embodiment with the structure described above will be described.

As shown in FIGS. 16 and 17, in the exposure heads 166 of the laser scanner 134, the respective laser beams B1, B2, B3, B4, B5, B6 and B7, which are emitted in divergent forms from the respective UV-type semiconductor lasers LD1 to LD7 that structure the multiplex laser light sources of the fiber array light sources 66, are converted to parallel light by the corresponding collimator lenses 11 to 17. The laser beams B1 to B7 that have been collimated are focused by the condensing lens 20, and converge at the incidence end face of the core 30a of the multi-mode optical fiber 30.

In the present embodiment, a condensing optical system is structured by the collimator lenses 11 to 17 and the condensing lens 20, and a multiplexing optical system is structured by the condensing optical system and the multi-mode optical fiber 30. Thus, the laser beams B1 to B7 focused by the condensing lens 20 as described above enter the core 30a of the multi-mode optical fiber 30, are propagated in the optical fiber, multiplexed to a single laser beam B, and emitted from the optical fiber 31 coupled at the emission end portion of the multi-node optical fiber 30.

In each laser module, a coupling efficiency of the laser beams B1 to B7 into the multi-mode optical fiber 30 is 0.85. Therefore, in a case in which the respective outputs of the UV-type semiconductor lasers LD1 to LD7 are 30 mW, the multiplexed laser beam B can be obtained with an output of 180 mW (=30 mW×0.85×7) from each of the optical fibers 31 arranged in the array pattern. Accordingly, output of the laser emission portion 68 in which six of the optical fibers 31 are arranged in the array pattern is approximately 1 W (=180 mW×6).

At the laser emission portion 68 of the fiber array light source 66, high-luminance light emission points are arranged in a single row along the main scanning direction. Because a conventional fiber light source, in which laser light from a single semiconductor laser is focused at a single optical fiber, has low output, a desired output could not be obtained without arranging these conventional light sources in a large number of rows. However, because the multiplex laser light source employed in the present embodiment has high output, a desired output can be obtained with only a small number of rows, for example, one row.

When the image data corresponding to the wiring patterns is inputted to the controller 190, the image data is temporarily stored at a frame memory in the controller 190. This image data is data which represents a density of each pixel structuring an image with a binary value (whether or not a dot is to be recorded).

In the laser exposure device 100, when the substrate material 102 has been transported from the pre-alignment table 136 to the exposure stage 108 by the entry lifter 140, the exposure stage 108 starts to be moved by the linear motor 110 from the entry position toward the exit position side. At this time, the transport control section 188 performs feedback control of the linear motor 110 such that the exposure stage 108 moves highly accurately at a speed for exposure by the laser scanner 134. Further, before commencing exposure, the measurement distance LM between the CCD cameras 124, 126 and 128 and the laser scanner 134 is adjusted in accordance with the pitch PT of the alignment marks 132 that respectively correspond to leading ends and trailing ends of the imaging regions 131. Specifically, the measurement distance LM is adjusted to a value obtained by adding approximately 10 to 50 mm to the pitch PT of the alignment marks 132 respectively corresponding to the leading ends and trailing ends of the imaging regions 131 (see FIGS. 3A and 3B).

The controller 190 determines the position of the substrate material 102 on the exposure stage 108 in accordance with pulse signals from the linear encoder 116, and determines the positions of the alignment marks 132 of the substrate material 102 on the basis of image information. When the alignment marks 132 reach the image capture position PI of the CCD cameras 124, 126 and 128, the flashes 130 emit light and the image capture regions of the exposure-receiving surface 120, including the alignment marks 132, are captured by the CCD cameras 124, 126 and 128. Hence, the image information obtained by the CCD cameras 124, 126 and 128 is outputted to the image processing section 194. The image processing section 194 converts this image information to position information corresponding to positions of the alignment marks 132 along the scanning direction and the width direction, and the image processing section 194 outputs this position information to the controller 190.

Based on the position information of the alignment marks 132 from the image processing section 194, the controller 190 determines the respective positions of the plurality of alignment marks 132 provided to correspond to one of the imaging regions 131. From these positions of the alignment marks 132, the controller 190 respectively determines a position of the imaging region 131 along the scanning direction and the width direction, and an inclination amount of the imaging region 131 with respect to the scanning direction.

Thereafter, the controller 190 calculates a timing for beginning exposure of the imaging region 131 on the basis of the position of the imaging region 131 along the scanning direction. The controller 190 also executes conversion processing on the image data corresponding to the wiring pattern on the basis of the position of the imaging region 131 along the width direction and the inclination amount of the imaging region 131 with respect to the scanning direction. The controller 190 stores the converted image data in a frame memory. Here, as contents of the conversion processing, co-ordinate conversion processing which rotates the image data about a co-ordinate origin point and co-ordinate conversion processing which translates the image data along a co-ordinate axis corresponding to the width direction are included. Furthermore, as necessary, the controller 190 executes conversion processing to stretch or compress the image data in accordance with stretching amounts/compression amounts of the imaging region 131 along the width direction and the scanning direction.

In a case in which the imaging regions 131 are divided into the pluralities of sub-regions 131A and 131B along the scanning direction by the alignment marks 132, as shown in FIG. 3B, the controller 190 determines the respective positions and inclinations of the subregions 131A and 131B and executes the conversion processing described above on each of sets of image data corresponding to the respective sub regions 131A and 131B.

After the alignment marks 132 corresponding to the trailing end of the imaging region 131 have passed the imaging position, the controller 190 outputs an exposure commencement signal to the scanner control section 192 synchronously with a time at which the leading end of the imaging region 131 reaches the exposure position PE. Accordingly, the scanner control section 192 reads out the image data stored in the frame memory as a sequential plurality of line portions. On the basis of the image data that is read out thus, control signals are generated at each of the exposure heads 166 by a data processing section, and the micromirrors of the DMD 50 at each exposure head 166 are respectively switched on or off by a mirror driving control section on the basis of these control signals.

When laser light is irradiated from the fiber array light source 66 to the DMD 50, if a micromirror of the DMD 50 is in the ON state, the reflected laser light is focused on the exposure-receiving surface 56 of the substrate material 102 by the lens systems 54 and 58. Thus, the laser light emitted from the fiber array light source 66 is turned on or off at each pixel, and the imaging region 131 of the substrate material 102 is exposed in a unit (the exposure area 168) with a number of pixels substantially the same as the number of pixels employed at the DMD 50. As the substrate material 102 (the substrate material 102) is moved together with the exposure stage 108 at a constant speed, the substrate material 102 is sub-scanned in a direction opposite to the stage movement direction by the laser scanner 134, and the strip-form exposed regions 170 are formed at the respective exposure heads 166 (see FIGS. 7, 8A and 8B).

Figure 21A:
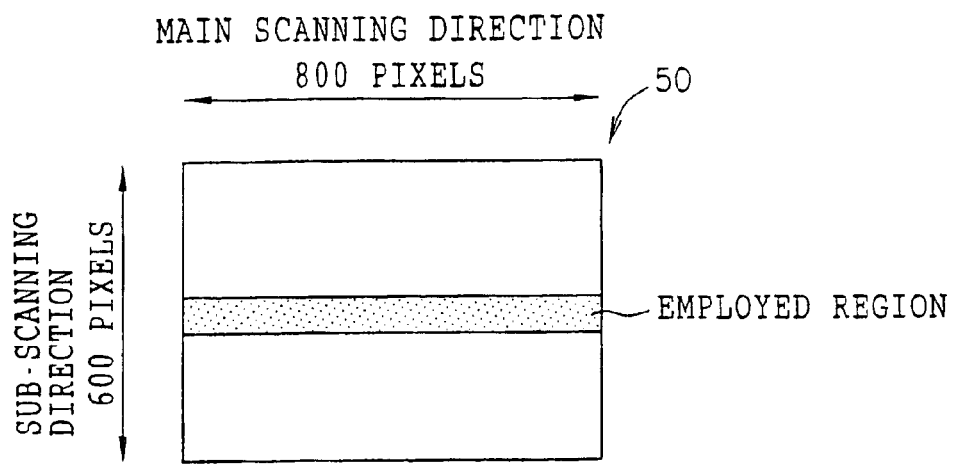
FIG. 21A is a view showing rows of an employed region of a DMD.
Figure 21B:
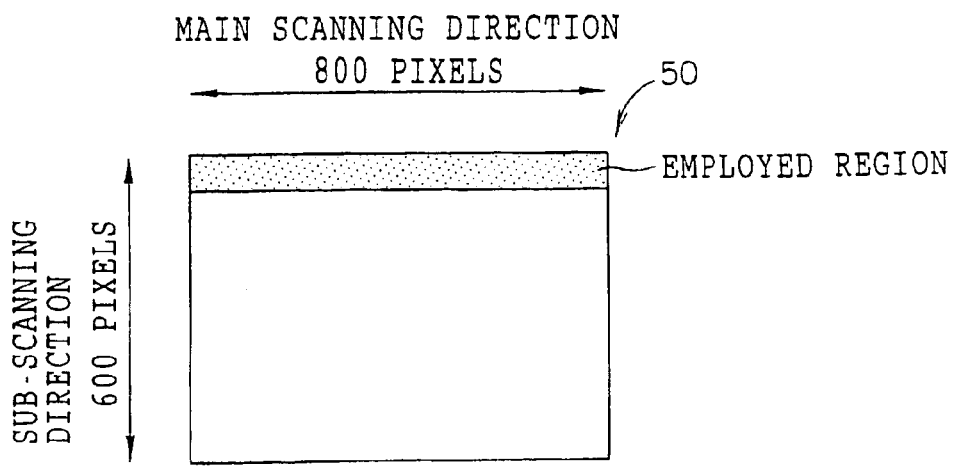
FIG. 21B is a view showing rows of another employed region of the DMD.
Figure 22A:
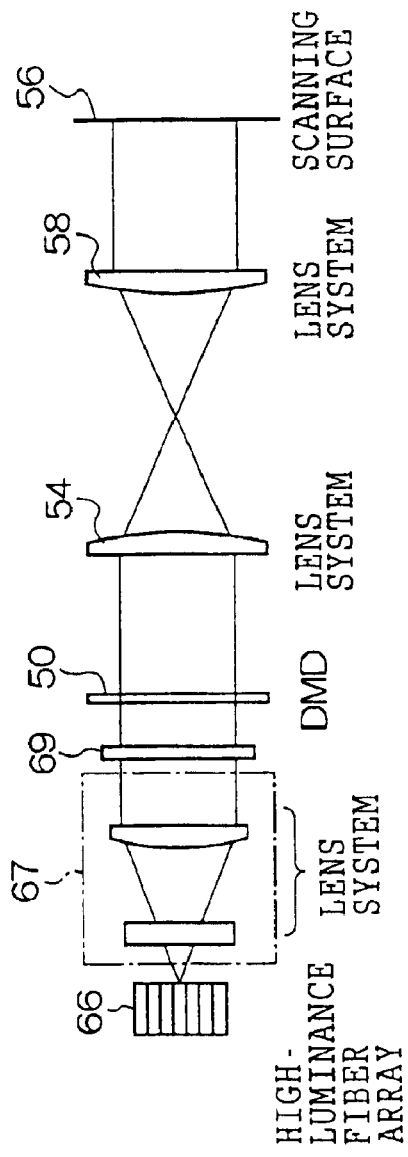
FIG. 22A is a side view of a case in which an employed region of the DMD is appropriate.
Figure 22B:
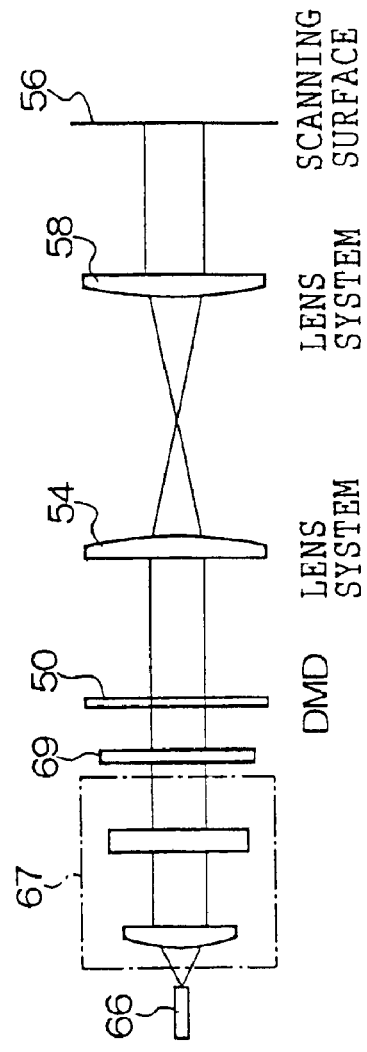
FIG. 22B is a sectional view, cut in a sub-scanning direction along an optical axis, of FIG. 22A.

As shown in FIGS. 21A and 21B, at the DMD 50 in the present embodiment, 600 micromirror rows, in each of which 800 of the micromirrors are arranged in the main scanning direction, are arranged in the sub-scanning direction. However, control by a controller so as to drive only a portion of the micromirror rows (for example, 800 micromirrors by 100 rows) is possible.

Micromirror rows that are disposed at a central portion of the DMD 50 may be employed, as shown in FIG. 21A, and micromirror rows that are disposed at an end portion of the DMD 50 may be employed, as shown in FIG. 21B. Further, in a case in which defects have occurred at some of the micromirrors, the micromirror rows that are to be employed may be suitably changed in accordance with the situation, by employing micromirror rows in which defects have not occurred, or the like.

There is a limit to a data processing speed of the DMD 50, and a modulation rate for one line is determined in proportion to the number of pixels employed. Thus, the modulation rate for one line can be accelerated by employing only a portion of the micromirror rows. Further, in the case of an exposure technique in which the exposure head is continuously moved relative to the exposure surface, there is no need to employ all pixels in the sub-scanning direction.

For example, in a case in which only 300 of the 600 rows of micromirrors are employed, modulation is possible at twice the rate for one line as in a case in which all 600 lines are employed. Further, in a case in which only 200 of the 600 rows of micromirrors are employed, modulation is possible three times as quickly for one line as in the case of employing all 600 lines. Specifically, a region which is 500 mm in the sub-scanning direction may be exposed in 17 seconds. Furthermore, in a case in which only 100 lines are employed, modulation for one line can be done six times as quickly. That is, a region which is 500 mm in the sub-scanning direction can be exposed in 9 seconds.

The number of micromirror rows that are employed, that is, the number of micromirrors arranged in the sub-scanning direction, is preferably at least 10 and at most 200, and is more preferably at least 10 and at most 100. Therefore, given that an area corresponding to one micromirror, which corresponds to one pixel, is 15 $\mu$m×15 $\mu$m, an employed region of the DMD 50 is preferably at least 12 mm by 150 $\mu$m and at most 12 mm by three mm, and more preferably at least 12 mm by 150 $\mu$m and at most 12 mm by 1.5 mm.

When the controller 190 completes exposure of the imaging region 131 that is positioned closest to the leading end of the substrate material 102, the alignment marks 132 that are provided to correspond to a second of the imaging regions 131 are image-captured at the image capture position PI in the same manner as in the case of the imaging region 131 closest to the leading end. On the basis of the image information provided by this image capture, the position and inclination of the second imaging region 131 are determined. Thereafter, exposure of the second imaging region 131 is executed on the basis of image data which has been subjected to conversion processing on the basis of this position and inclination. These operations are repeated until exposure has been completed for the imaging region 131 that is positioned closest to the trailing end of the substrate material 102.

After the controller 190 has completed exposure of all of the imaging regions 131 of the substrate material 102, when the exposure stage 108 reaches the exit position, the exposure stage 108 is stopped at the exit position by the linear motor 110 and the substrate material 102 is transported from the exposure stage 108 to the roller conveyor 146 by the exit lifter 150. When the substrate material 102 has been lifted up from the exposure stage 108 by the exit lifter 150, the controller 190 causes the linear motor 110 to commence movement of the exposure stage 108 toward the entry position at a speed faster than the exposure speed (around 10 to 20 times faster than the exposure speed), and the exposure stage 108 is returned to the entry position.

Then, the controller 190 transports another of the substrate material 102 from the pre-alignment table 136 to the exposure stage 108 with the entry lifter 140. At this time, the substrate material 102 is adsorbed by the arm portion 144 beforehand and the arm portion 144 is prepared in standby above the entry position before the exposure stage 108 has returned to the entry position. As a result, time that is required for transporting the substrate material 102 onto the exposure stage 108 can be shortened. Subsequent to this substrate material 102 being placed on the exposure stage 108 at the entry position, the substrate material 102 is moved along the stage movement direction to the exit position side, the imaging regions 131 on the substrate material 102 are exposed by laser light, and the latent images corresponding to the wiring patterns are formed at the imaging region 131. Herein, if the image data is to be changed, the controller 190 adjusts the measurement distance LM between the CCD cameras 124, 126 and 128 and the laser scanner 134 in accordance with a pitch of the alignment marks 132, which is determined from the new image data, before commencing exposure operations on the next substrate material 102.

In the laser exposure device 100 of the present embodiment as described above, the measurement distance LM in the scanning direction from the CCD cameras 124, 126 and 128 to the laser scanner 134 is set to a length not less than the pitch PT of the alignment marks 132 provided to correspond to the respective leading ends and trailing ends of the imaging regions 131. Therefore, when an arbitrary imaging region 131 at the substrate material 102 is to be exposed by the laser beam B from the laser scanner 134, at a point in time at which the alignment marks 132 corresponding to the leading end of this imaging region 131 reach the exposure position, the alignment marks 132 corresponding to the trailing end of this imaging region 131 will necessarily have passed the image capture position PI, and the alignment marks 132 respectively corresponding to the leading end and trailing end of this imaging region 131 will have already been read by the CCD cameras 124, 126 and 128. Thus, relative movement of the substrate material 102 in the scanning direction can be continued from commencement to completion of exposure of the arbitrary imaging region 131 without stopping the substrate material 102 in order to read the alignment marks 132 or returning the substrate material 102 relatively in the direction opposite to the scanning direction and, after the position and inclination of the imaging region 131 have been determined, the laser scanner 134 can expose the imaging region 131 which is the object of exposure with a light beam modulated on the basis of image data. Consequently, even in a case in which a plurality of the imaging regions 131 is provided at one plate of the substrate material 102, an increase in exposure duration (image-forming duration) of the substrate material 102 in accordance with the increase in the number of imaging regions 131 can be avoided.

Second Embodiment

Figure 4:
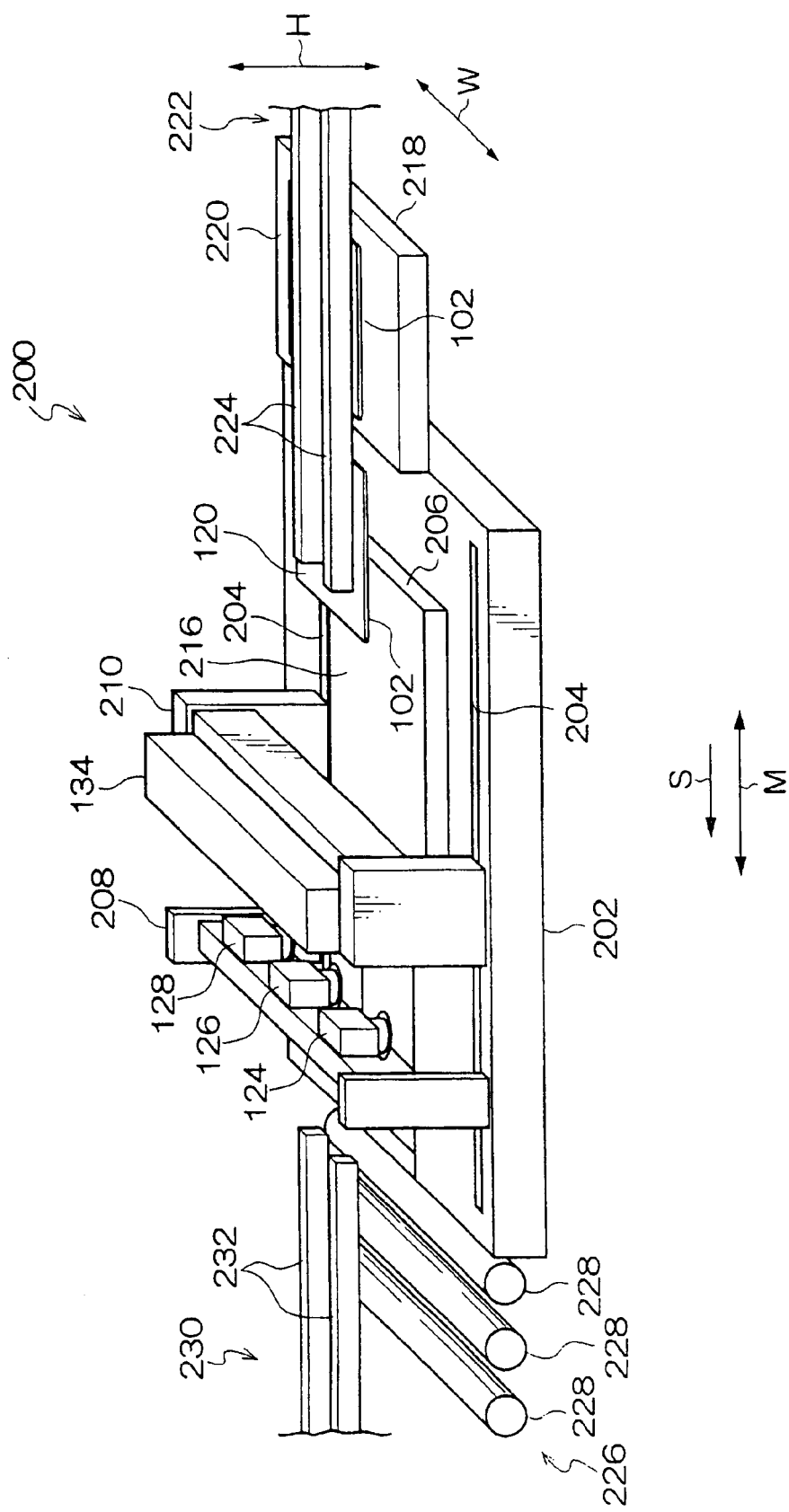
FIG. 4 is a perspective view showing external appearance of a laser exposure device relating to a second embodiment of the present invention.
Figure 5:
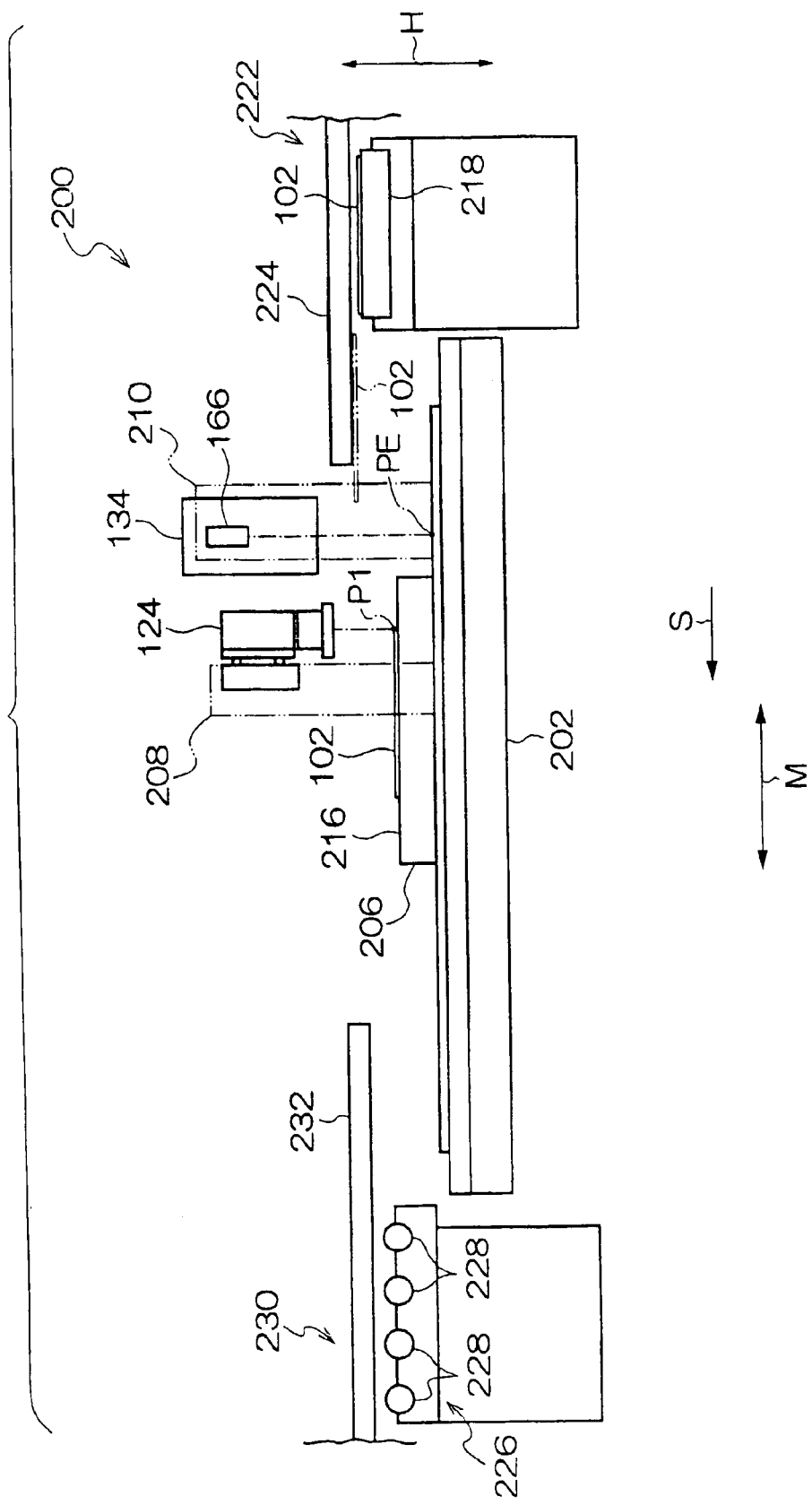
FIG. 5 is a side view showing the external appearance of the laser exposure device relating to the second embodiment of the present invention.
Figure 6:
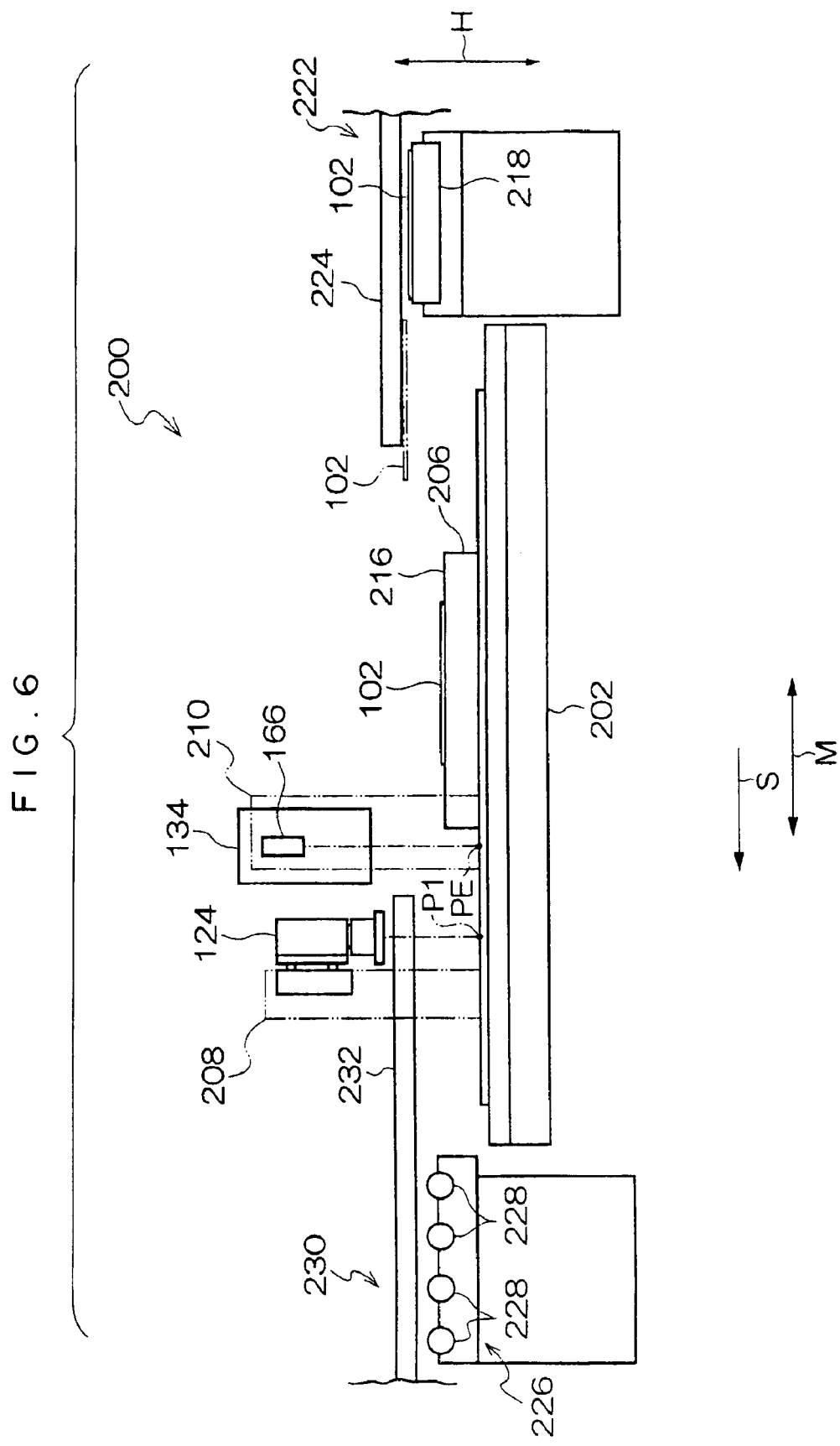
FIG. 6 is a side view showing the external appearance of the laser exposure device relating to the second embodiment of the present invention.

FIGS. 4 to 6 show a laser exposure device 200 relating to a second embodiment of the present invention. This laser exposure device 200, similarly to the laser exposure device 100 relating to the first embodiment, exposes the substrate material 102 with a laser beam B modulated in accordance with image data and forms an image (a latent image), which corresponds to a wiring pattern of a printed circuit board, on the substrate material 102. Note that portions that are common to the laser exposure device 200 relating to the second embodiment and the laser exposure device 100 relating to the first embodiment are assigned the same reference numerals, and descriptions thereof are omitted.

As shown in FIG. 4, a support platform 202, which is formed in a thick plate shape, is provided at the laser exposure device 200. The support platform 202 is provided such that a surface form thereof has a substantially rectangular shape with a longitudinal direction aligned in the direction of scanning of the substrate material 102 (the direction of arrow S). A pair of guide grooves 204, which respectively extend straightward in the stage movement direction (the direction of arrow M) parallel to the scanning direction are formed in an upper face end portion of the support platform 202. A plate-form exposure stage 206 is disposed on the support platform 202 between the pair of guide grooves 204 in the width direction (the direction of arrow W), at a central vicinity in the stage movement direction.

A support gate 208 and a support gate 210, which are formed substantially in 'n' shapes opening downwards, are disposed so as to straddle the exposure stage 206 on the support platform 202. Lower end portions at both sides of both the support gate 208 and the support gate 210 are respectively inserted into the guide grooves 204. Linear motors 212 and 214 see FIG. 23) are disposed inside the support platform 202. The lower end portions of both sides of the support gates 208 and 210 are coupled, through the guide grooves 204, to the linear motors 212 and 214. The linear motors 212 and 214 respectively drive the support gates 208 and 210 along the stage movement direction.

The plurality (three in the present embodiment) of the CCD cameras 124, 126 and 128 are mounted at the support gate 208, which is disposed at a downstream side (the left side of FIG. 4) in the scanning direction), and the laser scanner 134 is mounted at the support gate 210, which is disposed at an upstream side (the right side of FIG. 4). Here, the CCD cameras 124, 126 and 128 and the laser scanner 134 respectively have the same structures as those used in the laser exposure device 100 of the first embodiment.

As shown in FIG. 5, the upper face portion of the exposure stage 206 is made to serve as a flat surface-form placing face 216, at which the substrate material 102 is placed. Suction channels (not shown) for adsorbing the substrate material 102 by negative pressure are formed in this placing face 216. Negative pressure is supplied to these adsorption channels, by a vacuum generation device such as a vacuum pump or the like, when the substrate material 102 is placed on the placing face 216. As a result, the substrate material 102 placed on the placing face 216 is fixed on the placing face 216 in a tightly adhered state by the action of the negative pressure in the adsorption channels. Here, as shown in FIGS. 5 and 6, the support gate 208 at which the CCD cameras 124, 126 and 128 are mounted is made to be movable relative to the exposure stage 206 in a range from an image capture standby position at a scanning direction upstream side to an image capture completion position at a scanning direction downstream side, and the support gate 210 at which the laser scanner 134 is mounted is made to be movable relative to the exposure stage 206 in a range from an exposure standby position at the scanning direction upstream side to an exposure completion position at the scanning direction downstream side.

As shown in FIG. 4, in the laser exposure device 200, a flat plate-form pre-alignment table 218 is disposed at an upstream side of the support platform 202 along the scanning direction (the right side in FIG. 4). An upper face portion of this pre-alignment table 218 serves as a flat surface-form placing face 220. Positioning protrusions 221 are provided at this placing face 220 for positioning the substrate material 102 at a predetermined placing position along the stage movement direction and the width direction. In the laser exposure device 200, after image formation has been completed, when the exposure stage 206 returns from an exit position to an entry position, another plate of the substrate material 102 is placed on the placing face 220 of the pre-alignment table 218 such that a leading end and one side of the substrate material 102 respectively abut against the positioning protrusions 221. Thus, the substrate material 102 is positioned at the placing position on the placing face 220 with a consistent positioning accuracy.

In the laser exposure device 200, an entry lifter 222 is provided for transporting the substrate material 102, which has been placed on the pre-alignment table 218, onto the exposure stage 206 at the entry position. The entry lifter 222 is equipped with a pair of arm portions 224. The arm portions 224 extend toward the downstream side along the scanning direction from a main body portion (not shown), which is disposed at an upstream side of the pre-alignment table 218. The arm portions 224 are supported by the main body portion to be movable along the stage movement direction and a vertical direction (the direction of arrow H). Lower faces at a distal end side of these arm portions 224 serve as adsorption surfaces for the substrate material 102, in which pluralities of adsorption holes (not shown) are formed. A vacuum generation device such as a vacuum pump or the like is connected to the adsorption holes of the arm portions 224.

When the substrate material 102 is placed on the pre-alignment table 218, the entry lifter 222 adsorbs this substrate material 102 with the arm portions 224, transports the substrate material 102 from on the pre-alignment table 218 to on the exposure stage 206, and places the substrate material 102 on the placing face 216 of the exposure stage 206. At this time, the entry lifter 222 causes the center of the exposure-receiving surface 120 and a center of the placing face 216 to coincide, and places the substrate material 102 at a predetermined reference position of the placing face 216 without causing an inclination of the substrate material 102 with respect to the stage movement direction. However, a slight positioning error of the substrate material 102 in relation to the reference position will inevitably occur due to the effects of a positioning error when the substrate material 102 is placed on the pre-alignment table 218, a positioning error when the arm portions 224 are stopped over the exposure stage 206, and the like.

As shown in FIG. 4, in the laser exposure device 200, a roller conveyor 226 is disposed at a downstream side of the support platform 202 along the scanning direction (the left side in FIG. 4). This roller conveyor 226 is equipped with a plurality of transport rollers 228, which are arranged along the stage movement direction, and a driving section (not shown) which rotates these transport rollers 228. When the substrate material 102 is placed at the support platform 202 side end portion of the roller conveyor 226, the roller conveyor 226 transports the substrate material 102, using the plurality of transport rollers 228, away from the support platform 202 in an exit direction and transports this substrate material 102 to a stacking tray or the like for temporary holding.

Further, in the laser exposure device 200, an exit lifter 230 is provided at the exit position for transporting the substrate material 102 that has been placed on the exposure stage 206 onto the roller conveyor 226. The exit lifter 230 is equipped with a pair of arm portions 232. The arm portions 232 extend toward the upstream side along the scanning direction from a main body portion (not shown), which is disposed at a downstream side of the roller conveyor 226. The arm portions 232 are supported by this main body portion to be movable along the stage movement direction and the vertical direction (the direction of arrow H). Lower faces at a distal end side of these arm portions 232 serve as adsorption surfaces for the substrate material 102, in which pluralities of adsorption holes (not shown) are formed. A vacuum generation device such as a vacuum pump or the like is connected to the adsorption holes of the arm portions 232.

When exposure of the substrate material 102 on the exposure stage 206 has been completed, the exit lifter 230 adsorbs the substrate material 102 on the exposure stage 206 with the arm portions 232, transports the substrate material 102 from on the exposure stage 206 to on the roller conveyor 226, and places the substrate material 102 on an end portion of the roller conveyor 226. In accordance therewith, the roller conveyor 226 begins transport of the substrate material 102 in the exit direction.

Figure 23:
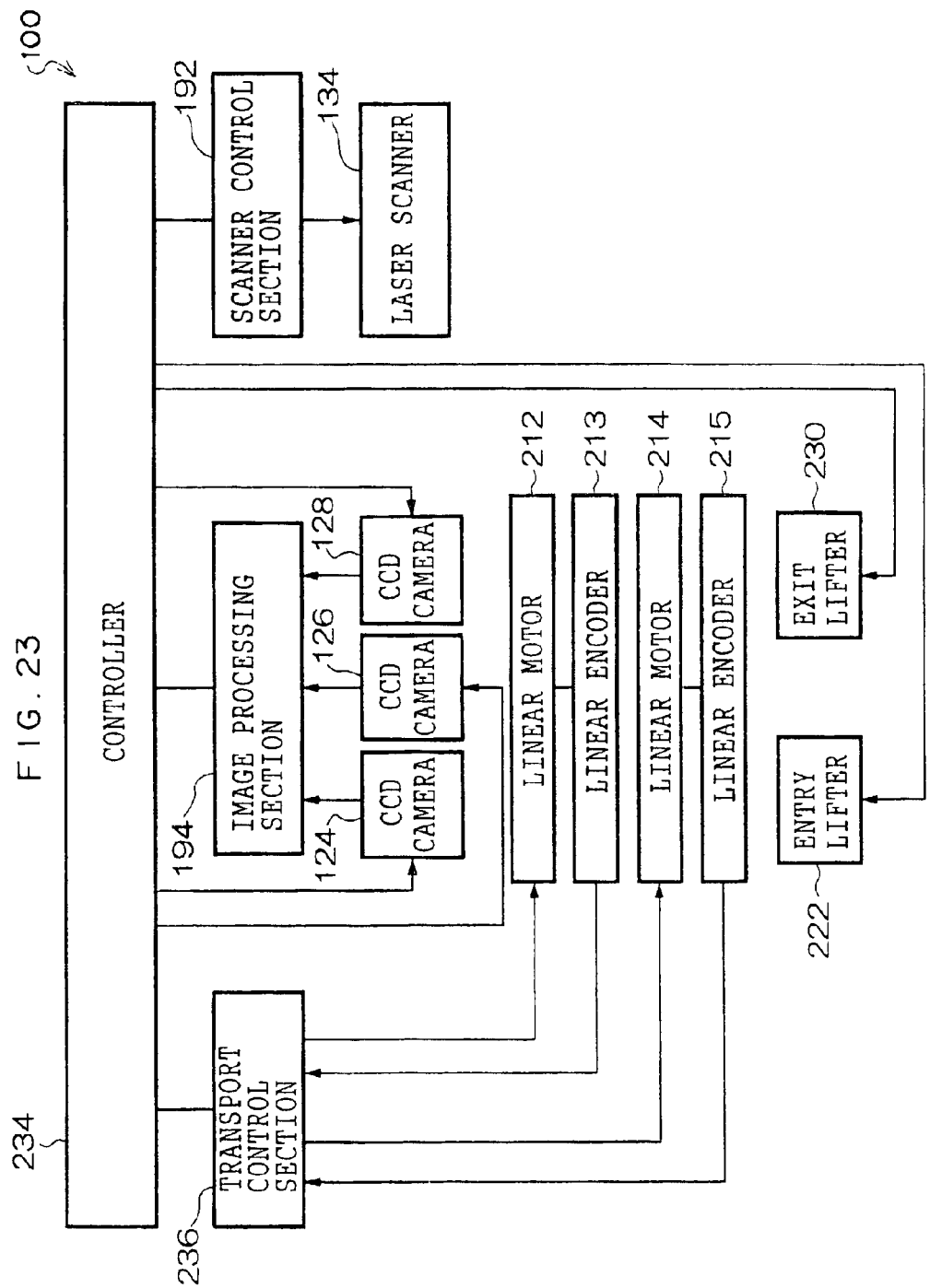
FIG. 23 is a block diagram showing general structure of a control system of the laser exposure device relating to the second embodiment of the present invention.

Next, structure of a control system of the laser exposure device 200 will be described. As shown in FIG. 23, the laser exposure device 200 is equipped with a controller 234, for controlling the device as a whole. A transport control section 236, the image processing section 194 and the scanner control section 192 are respectively connected to the controller 234.

The transport control section 236 is connected to the linear motor 212 and a linear encoder 213, which are coupled to the support gate 208. The transport control section 236 outputs driving pulse signals to the linear motor 212 at times of movement of the support gate 208 and controls driving of the linear motor 212. At this time, the transport control section 236 performs feedback control of the linear motor 212 on the basis of pulse signals from the linear encoder 213. Further, the transport control section 236 is connected to the linear motor 214 and a linear encoder 215, which are coupled to the support gate 210. The transport control section 236 outputs driving pulse signals to the linear motor 214 at times of movement of the support gate 210 and controls driving of the linear motor 214. At this time, the transport control section 236 performs feedback control of the linear motor 214 on the basis of pulse signals from the linear encoder 215.

Next, operation of the laser exposure device 200 relating to the present embodiment with the structure described above will be described.

In the laser exposure device 200, when the substrate material 102 has been transported from the pre-alignment table 218 to the exposure stage 206 by the entry lifter 222, the support gate 208 starts to be moved by the linear motor 212 from the exposure standby position toward the exposure completion position side. At this time, the transport control section 236 moves the support gate 208 non-continuously such that the CCD cameras 124, 126 and 128 mounted at the support gate 208 temporarily stop at an image capture position PI corresponding to the alignment marks 132 of the substrate material 102. Specifically, an average speed of movement of the CCD cameras 124, 126 and 128 in the scanning direction is set to a speed of movement at the image capture position PI such that this speed is faster than the speed for exposure by the laser scanner 134.

Now, if the speed of the CCD cameras 124, 126 and 128 is faster than the exposure speed, the CCD cameras 124, 126 and 128 may be moved in the scanning direction at a constant speed without being stopped over the alignment marks 132. Further, in a case in which it is possible to consistently open a predetermined spacing from the laser scanner 134 in advance, the CCD cameras 124, 126 and 128 may be moved at a scanning speed which is a speed equal to the exposure speed, similarly to the case of the laser exposure device 100 relating to the first embodiment.

The controller 234 stops the CCD cameras 124, 126 and 128 corresponding to the support gate 208 at the image capture position PI corresponding to the alignment marks 132, the flashes 130 emit light and the image capture regions including the alignment marks 132 of the substrate material 102 are captured by the CCD cameras 124, 126 and 128. Hence, the image information obtained by the CCD cameras 124, 126 and 128 is outputted to the image processing section 194. The image processing section 194 converts this image information to position information corresponding to positions of the alignment marks 132 along the scanning direction and the width direction, and the image processing section 194 outputs this position information to the controller 234.

Based on the position information of the alignment marks 132 from the image processing section 194, the controller 234 determines the respective positions of the plurality of alignment marks 132 provided to correspond to one of the imaging regions 131. From these positions of the alignment marks 132, the controller 234 respectively determines a position of the imaging region 131 along the scanning direction and the width direction and an inclination amount of the imaging region 131 with respect to the scanning direction.

After at least the support gate 208 has passed over the alignment marks 132 corresponding to the trailing end of the imaging region 131 that is closest to the upstream side, the controller 234 causes the linear motor 214 to commence movement of the support gate 210 from the exposure standby position toward the exposure completion position side. At this time, the transport control section 236 performs driving control of the linear motor 214 in accordance with pulse signals from the linear encoder 215 such that the support gate 210 moves accurately at the speed for exposure by the laser scanner 134.

The controller 234 calculates a timing for beginning exposure of the imaging region 131 on the basis of the position of the imaging region 131. The controller 234 also executes conversion processing on the image data corresponding to the wiring pattern on the basis of the position of the imaging region 131 along the width direction and the inclination amount of the imaging region 131 with respect to the scanning direction. The controller 234 stores the converted image data in a frame memory. Here, as contents of the conversion processing, co-ordinate conversion processing which rotates the image data about a co-ordinate origin point and co-ordinate conversion processing which translates the image data along a co-ordinate axis corresponding to the width direction are included. Furthermore, as necessary, the controller 234 executes conversion processing to stretch or compress the image data in accordance with stretching amounts/compression amounts of the imaging region 131 along the width direction and the scanning direction.

In a case in which the imaging regions 131 are divided into the pluralities of sub-regions 131A and 131B along the scanning direction according to the alignment marks 132, as shown in FIG. 3B, the controller 234 determines the respective positions and inclinations of the sub-regions 131A and 131B and executes the conversion processing described above on each of sets of image data corresponding to the respective sub-regions 131A and 131B.

After the image capture position according to the CCD cameras 124, 126 and 128 has passed the alignment marks 132 corresponding to the trailing end of the imaging region 131, the controller 234 outputs an exposure commencement signal to the scanner control section 192 synchronously with a time at which the leading end of the imaging region 131 reaches the exposure position PE. Accordingly, the scanner control section 192 reads out the image data stored in the frame memory as a sequential plurality of line portions. On the basis of the image data that is read out thus, control signals are generated at each of the exposure heads 166 by a data processing section, and the micromirrors of the DMD 50 at each exposure head 166 are respectively switched on or off by a mirror driving control section on the basis of these control signals. Thus, exposure of the imaging region 131 positioned closest to the leading end of the substrate material 102 proceeds.

At this time, an average speed of movement of the CCD cameras 124, 126 and 128 mounted at the support gate 208 is a faster speed than the exposure speed of the laser scanner 134. Therefore, when exposure of the imaging region 131 closest to the leading end has been completed, image capture of all of the alignment marks 132 corresponding to the imaging region 131 that is positioned second has been completed by the CCD cameras 124, 126 and 128, and the position and inclination of the second imaging region 131 have been determined by the controller 234. When exposure of the imaging region 131 that is positioned closest to the leading end of the substrate material 102 has been completed, the controller 234 executes exposure of the second imaging region 131 on the basis of image data which has been subjected to conversion processing on the basis of the position and inclination of the second imaging region 131. These operations are repeated until exposure has been completed for the imaging region 131 that is positioned closest to the trailing end of the substrate material 102.

After the support gate 208 has reached the image capture completion position as shown in FIG. 6, and the support gate 210 has reached the exposure completion position as shown in FIG. 6, the controller 234 moves the support gates 208 and 210 respectively toward the scanning direction upstream side and returns the support gates 208 and 210 to an image capture commencement position and an exposure commencement position. In addition, the substrate material 102 is transported from the exposure stage 206 to the roller conveyor 226 by the exit lifter 230. At this time, the controller 234 moves the support gates 208 and 210 toward the scanning direction upstream side at a speed faster than the exposure speed (around 10 to 20 times faster than the exposure speed).

Then, the controller 234 transports another of the substrate material 102 from the pre-alignment table 218 to the exposure stage 206 with the entry lifter 222. When this substrate material 102 has been placed on the exposure stage 206, the imaging regions 131 on the substrate material 102 are exposed by laser light while the support gates 208 and 210 are moved in the scanning direction, and latent images corresponding to the wiring patterns are formed at the imaging regions 131. Herein, if the image data is to be changed, the controller 234 re-sets the position of stopping of the support gate 208 in accordance with a pitch PT of the alignment marks 132, which is determined from this new image data.

In the laser exposure device 200 of the present embodiment as described above, during exposure of the imaging region 131 whose position has been determined by the image processing section 194, the controller 234 moves the laser scanner 134 in the scanning direction at the speed for exposure at which exposure of imaging region 131 is effected. Further, the CCD cameras 124, 126 and 128 are moved along the scanning direction such that the CCD cameras 124, 126 and 128 have passed over the alignment marks 132 that respectively correspond to the leading end and trailing end of the imaging region 131 that is to be exposed by the laser scanner 134 before commencing exposure of the imaging region 131 with the laser scanner. Therefore, at a point in time at which exposure of an arbitrary imaging region 131 at the substrate material 102 by the laser beam B from the laser scanner 134 commences, that is, a point in time at which the leading end of the imaging region 131 that is the object of exposure reaches the exposure position, the alignment marks 132 corresponding to the leading end and trailing end of this imaging region 131 have each passed the reading position, and the alignment marks 132 respectively corresponding to the leading end and trailing end of this imaging region 131 will have already been read by a reading section. Thus, the exposure section can be kept moving at the predetermined exposure speed at which exposure is effected and the exposure section can expose the imaging region which is the object of exposure with a light beam which has been modulated on the basis of image data from an information processing section, from commencement to completion of exposure of the recording medium, without stopping the recording medium in order to read the alignment marks. Consequently, even in a case in which a plurality of the imaging regions is provided at the recording medium, an increase in a duration of image-forming of the recording medium in accordance with the increase in the number of imaging regions can be avoided.

In the explanations relating to the first and second embodiments as described above, only cases of exposing the substrate material 102, which is a material for a printed circuit board, with the laser exposure device 100 or 200 have been described. However, exposure devices having structures relating to the present invention may be employed for direct exposure of photosensitive printing plates such as PS plates, CT plates and the like, and photosensitive materials such as photosensitive paper and the like. As light beams for exposing these, not only laser beams but also visible light rays, X-rays and the like may be employed.

According to an exposure device relating to the present invention as described above, even in a case in which a plurality of imaging regions are provided at a recording medium, an increase in a duration of image formation on the recording medium in accordance with the increase in the number of imaging regions can be prevented.

What is claimed is:

1. An exposure device for exposing a predetermined imaging region at a recording medium with a light beam, which has beens modulated in accordance with image data, for forming an image corresponding to the image data at the imaging region, the exposure device comprising:

an exposure stage on which the recording medium is placed;

a reading section which, at a reading position facing the recording medium on the exposure stage, reads alignment marks from the recording medium, the alignment marks having been provided to correspond to the imaging region;

an information processing section which determines a position of the imaging region at the recording medium on the basis of read information from the reading section, and performs position conversion processing on the image data in accordance with the position of the imaging region; and an exposure section disposed at an upstream side, along a scanning direction, of the reading section, which exposure section exposes, at an exposure position facing the recording medium on the exposure stage, the imaging region of the recording medium with the light beam, which has been modulated on the basis of image data from the information processing section, for forming the image at the imaging region, wherein the reading section and the exposure section are structured to be relatively movable in the scanning direction with respect to the recording medium on the exposure stage, by at least one of relatively moving the exposure stage with respect to the reading section and the exposure section and relatively moving the reading section and the exposure section with respect to the exposure stage, and before commencement of exposure of the imaging region by the exposure section, the reading section reads the alignment marks that correspond to at least one of a leading end and trailing end of the imaging region that is to be exposed by the exposure section and a leading end and trailing end of a sub-region into which the imaging region is divided in the scanning direction, and the information processing section performs the position conversion processing on the image data on the basis of read information of these alignment marks.

2. The exposure device of claim 1, wherein the exposure stage is relatively movable with respect to the reading section and the exposure section, such that the reading section and the exposure section are relatively movable in the scanning direction with respect to the recording medium.

3. The exposure device of claim 2, wherein a distance along the scanning direction from the reading section to the exposure section is set to a length greater than or equal to a pitch of the alignment marks that are provided to respectively correspond to the at least one of: the leading end and trailing end of the imaging region that is to be exposed by the exposure section; and the leading end and trailing end of the sub-region into which the imaging region is divided in the scanning direction.

4. The exposure device of claim 3, further comprising a stage driving section which, during reading of the alignment marks by the reading section and during exposure of the imaging region by the exposure section, moves the exposure stage at a speed for exposure at which exposure is carried out by the exposure section, in a direction opposite to the scanning direction, for moving the recording medium placed on the exposure stage in the scanning direction at the speed for exposure.

5. The exposure device of claim 3, further comprising an exposure position adjustment section which alters the distance along the scanning direction from the reading section to the exposure section in accordance with the pitch of the alignment marks that correspond to the imaging region, positions of the alignment marks being determined by the information processing section.

6. The exposure device of claim 1, wherein the information processing section determines the position of the imaging region for each sub-region, and performs the position conversion processing on the imaging region in accordance with each sub-region.

7. The exposure device of claim 1, wherein the reading section and exposure section are structured to be relatively movable in the scanning direction with respect to the recording medium on the exposure stage.

8. The exposure device of claim 7, further comprising an exposure section-driving section which, when exposure of the imaging region, whose position has been determined by the information processing section, is being performed, moves the exposure section in the scanning direction at a speed for image formation of the imaging region.

9. The exposure device of claim 8, further comprising a reading section-driving section which moves the reading section along the scanning direction such that the reading section passes reading positions of the alignment marks, that correspond to the at least one of the leading end and trailing end of the imaging region that is to be exposed by the exposure section and the leading end and trailing end of the sub-region into which the imaging region is divided in the scanning direction, before commencement of exposure of the imaging region by the exposure section.

10. An exposure device for exposing a predetermined imaging region at a recording medium with a light beam, which has been modulated on the basis of image data, while relatively moving the recording medium in a predetermined scanning direction, for forming an image corresponding to the image data at the imaging region, the exposure device comprising:

a reading section which reads alignment marks from the recording medium, at a reading position facing the recording medium which is moving relatively in the scanning direction, the alignment marks having been provided to correspond to the imaging region;

an information processing section which determines a position of the imaging region at the recording medium on the basis of information read by the reading section, and performs position conversion processing on the image data in accordance with the position of the imaging region; and an exposure section disposed at an upstream side, along the scanning direction, of the reading section, which exposure section exposes, at an exposure position facing the recording medium which is moving relatively in the scanning direction, the imaging region of the recording medium with the light beam, which has been modulated on the basis of image data from the information processing section, for forming the image at the imaging region, wherein a distance along the scanning direction from the reading section to the exposure section is set to a length greater than or equal to a pitch of the alignment marks that are provided to respectively correspond to at least one of a leading end and trailing end of the imaging region that is to be exposed by the exposure section and a leading end and trailing end of a sub-region, into which the imaging region is divided in the scanning direction.

11. The exposure device of claim 10, further comprising:

an exposure stage on which the recording medium is placed; and a stage driving section which, during reading of the alignment marks by the reading section and during exposure of the imaging region by the exposure section, moves the exposure stage at a speed for exposure at which exposure is carried out by the exposure section, in a direction opposite to the scanning direction, for moving the recording medium placed on the exposure stage in the scanning direction at the speed for exposure.

12. The exposure device of claim 11, further comprising an exposure position adjustment section which alters the distance along the scanning direction from the reading section to the exposure section in accordance with the pitch of the alignment marks that correspond to the imaging region, positions of the alignment marks being determined by the information processing section.

13. The exposure device of claim 11, wherein the information processing section determines the position of the imaging region for each sub-region, and performs the position conversion processing on the imaging region in accordance with each sub-region.

14. The exposure device of claim 13, wherein the reading of the alignment marks by the reading section, the position conversion processing by the information processing section on the basis of the information read by the reading section, and the image formation by the exposure section on the basis of the image data that has been subjected to the position conversion processing are performed separately for each sub-region.

15. An exposure device for exposing a predetermined imaging region at a recording medium with a light beam, which has been modulated in accordance with image data, for forming an image corresponding to the image data at the imaging region, the exposure device comprising:

an exposure stage on which the recording medium is placed;

a reading section which, while moving in a predetermined scanning direction, reads alignment marks from the recording medium, at a reading position facing the recording medium on the exposure stage, the alignment marks having been provided to correspond to the imaging region;

an information processing section which determines a position of the imaging region at the recording medium on the basis of information read by the reading section, and performs position conversion processing on the image data in accordance with the position of the imaging region;

an exposure section disposed at an upstream side, along the scanning direction, of the reading section, which exposure section, while moving in the scanning direction, exposes, at an exposure position facing the recording medium on the exposure stage, the imaging region of the recording medium with the light beam, which has been modulated on the basis of image data from the information processing section, for forming the image at the imaging region;

an exposure section-driving section which, during exposure of the imaging region, whose position has been determined by the information processing section, moves the exposure section in the scanning direction at a speed for image formation of the imaging region; and a reading section-driving section which moves the reading section along the scanning direction such that the reading section passes reading positions of the alignment marks that correspond to at least one of a leading end and trailing end of the imaging region that is to be exposed by the exposure section and a leading end and trailing end of a sub-region, into which the imaging region is divided in the scanning direction, before commencement of exposure of the imaging region by the exposure section.

16. The exposure device of claim 15, wherein the information processing section determines the position of the imaging region for each sub-region, and performs the position conversion processing on the imaging region in accordance with each sub-region.

17. The exposure device of claim 16, wherein the reading of the alignment marks by the reading section, the position conversion processing by the information processing section on the basis of the information read by the reading section, and the image formation by the exposure section on the basis of the image data that has been subjected to the position conversion processing are performed separately for each sub-region.

18. The exposure device of claim 15, wherein a speed of movement of the reading section is faster than a speed of exposure at which exposure is carried out by the exposure section.

* * * * *